(12) United States Patent
Iwata

(10) Patent No.: US 7,230,308 B2
(45) Date of Patent: Jun. 12, 2007

(54) MAGNETIC RANDOM ACCESS MEMORY

(75) Inventor: Yoshihisa Iwata, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 172 days.

(21) Appl. No.: 11/037,108

(22) Filed: Jan. 19, 2005

(65) Prior Publication Data
US 2006/0118842 A1    Jun. 8, 2006

(30) Foreign Application Priority Data
Dec. 8, 2004    (JP) ............................. 2004-355682

(51) Int. Cl.
   *H01L 29/82* (2006.01)
(52) U.S. Cl. .............................. 257/421; 257/E27.006; 257/295; 257/417; 257/420
(58) Field of Classification Search ................. 257/421
   See application file for complete search history.

(56) References Cited

U.S. PATENT DOCUMENTS

| | | |
|---|---|---|
| 5,239,504 A | 8/1993 | Brady et al. |
| 6,339,543 B1 | 1/2002 | Shimada et al. |
| 6,515,341 B2 | 2/2003 | Engel et al. |
| 6,545,906 B1 | 4/2003 | Savtchenko et al. |
| 2003/0123271 A1 | 7/2003 | Iwata |
| 2003/0123281 A1 | 7/2003 | Iwata et al. |
| 2004/0027854 A1 | 2/2004 | Iwata et al. |
| 2004/0042297 A1 | 3/2004 | Iwata et al. |
| 2004/0252551 A1 | 12/2004 | Iwata et al. |
| 2005/0106810 A1* | 5/2005 | Pakala et al. ............ 438/257 |

OTHER PUBLICATIONS

M. Durlam, et al., "A 0.18μm 4Mb Toggling MRAM", IEEE IEDM, 2003, pp. 34.6.1-34.6.3.
Klaus Schröder, "Stress operated random access, high-speed magnetic memory", J. Appl. Phys, vol. 53, No. 3, Mar. 1982, pp. 2759-2761.
Roy Scheuerlein, et al., "A 10ns Read and Write Non-Volatile Memory Array Using a Magnetic Tunnel Junction and FET Switch in each Cell", IEEE International Solid-State Circuits Conference Digest of Technical Papers, Feb. 8, 2000, pp. 128-129, pp. 94-95 from Slide Supplement, pp. 409-410 from Slide Supplement.
U.S. Appl. No. 11/037,108, filed Jan. 19, 2005, Iwata.
U.S. Appl. No. 11/305,203, filed Dec. 19, 2005, Iwata et al.
U.S. Appl. No. 10/162,605, filed Jun. 6, 2002, Iwata.
U.S. Appl. No. 10/180,517, filed Jun. 27, 2002, Iwata et al.
U.S. Appl. No. 10/465,616, filed Jun. 20, 2003, Iwata et al.
U.S. Appl. No. 10/438,015, filed May 15, 2003, Iwata et al.
U.S. Appl. No. 10/765,131, filed Jan. 28, 2004, Iwata et al.

* cited by examiner

*Primary Examiner*—Tu-Tu Ho
(74) *Attorney, Agent, or Firm*—Oblon, Spivak, McClelland, Maier & Neustadt, P.C.

(57) ABSTRACT

A magnetic random access memory according to an example of the present invention includes a magnetoresistive element, a write line for use in generation of a magnetic field for data writing with respect to the magnetoresistive element, and a strained layer which is disposed so as to correspond to the magnetoresistive element, and which has a function of being physically deformed at the time of data writing, and of controlling a magnitude of a switching magnetic field of the magnetoresistive element.

20 Claims, 22 Drawing Sheets

Asteroid curve

Asteroid curve

Asteroid curve

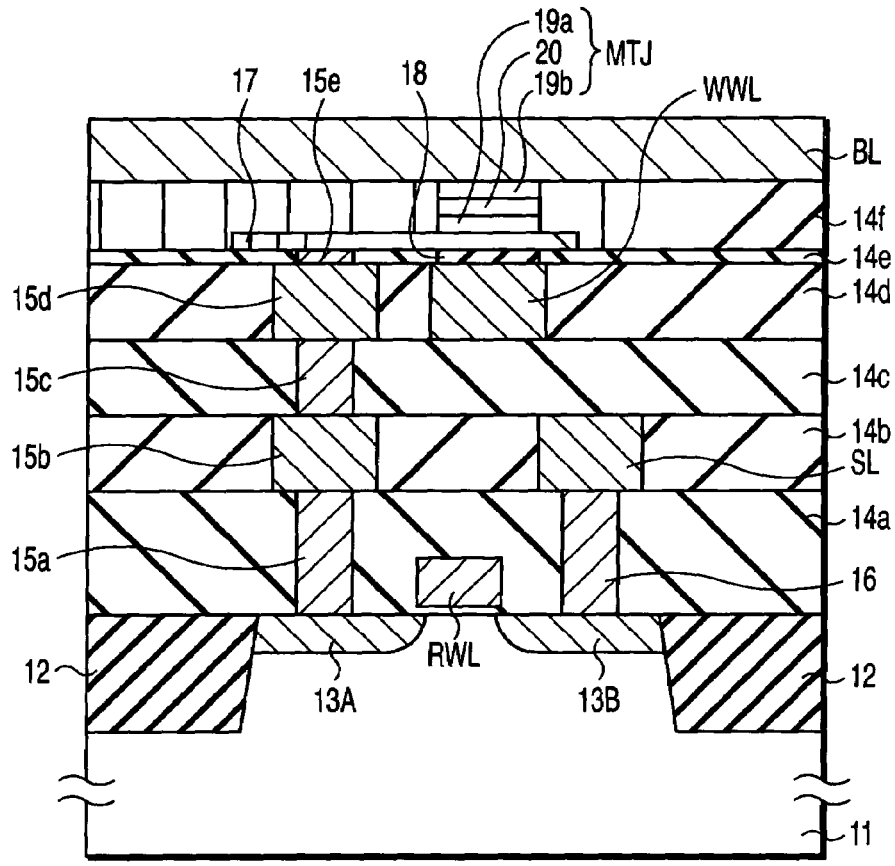
FIG. 12 — Hard axis direction
- Initial state, selected and unselected (except for half-selected) MTJ elements
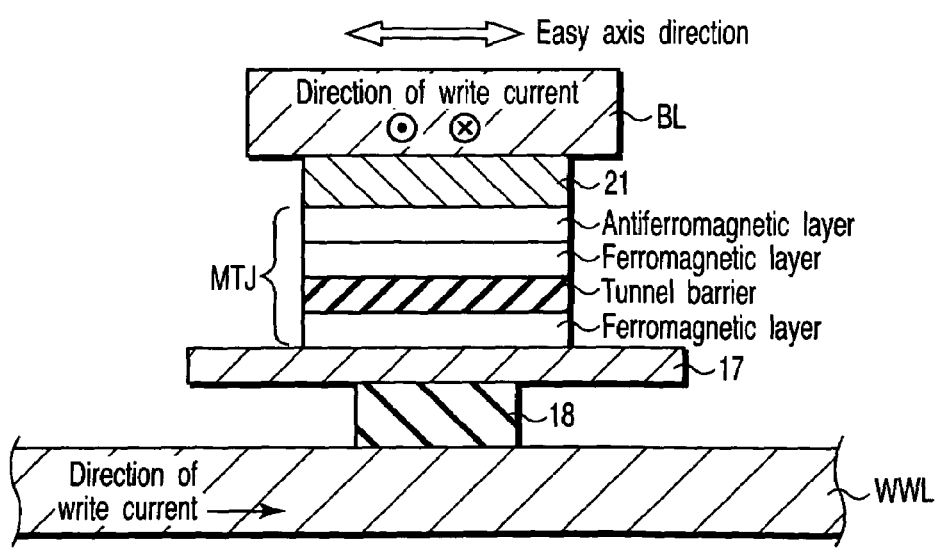
FIG. 14

• Initial state, selected and unselected (except for half-selected) MTJ elements

• Half-selected MTJ element

Hard axis direction (3) State in which electric current is made to flow into both of WWL and WBL (4) State in which electric current is made to flow into WBL

MAGNETIC RANDOM ACCESS MEMORY

CROSS-REFERENCE TO RELATED APPLICATIONS

This application is based upon and claims the benefit of priority from prior Japanese Patent Application No. 2004-355682, filed Dec. 8, 2004, the entire contents of which are incorporated herein by reference.

BACKGROUND OF THE INVENTION

1. Field of the Invention

The present invention relates to a magnetic random access memory (MRAM: Magnetic Random Access Memory) in which a memory cell array is comprised of storage elements using a magneto-resistance effect (Magneto Resistive).

2. Description of the Related Art

A magnetic random access memory using a tunneling magneto-resistance effect (TMR: Tunneling Magneto Resistive) is disclosed in, for example, [Roy Scheuerlein et al. "A 10 ns Read and Write Non-Volatile Memory Array Using a Magnetic Tunnel Junction and FET Switch in each Cell", ISSCC2000 Technical Digest, pp. 128–129]. The magnetic random access memory is characterized by storing data by a magnetized state of an MTJ (Magnetic Tunnel Junction) element.

An MTJ element showing a TMR has, for example, as shown in FIG. 1, a structure in which a tunnel insulating layer is sandwiched by two ferromagnetic layers. The MTJ element can take two states, and one is a parallel state in which the directions of the residual magnetizations of the two ferromagnetic layers sandwiching the tunnel insulating layer are the same, and the other one is an anti-parallel state in which the directions of the residual magnetizations of the two ferromagnetic layers sandwiching the tunnel insulating layer are opposite to one another.

As shown in FIG. 2, when the MTJ element is made to be in a parallel state, the tunneling resistive value of the MTJ element is made to be a minimum. Suppose that this state is, for example, a "0" state. On the other hand, as shown in FIG. 3, when the MTJ element is made to be in an anti-parallel state, the tunneling resistive value of the MTJ element is made to be a maximum. Suppose that this state is, for example, a "1" state.

Here, in order to prevent both of the two ferromagnetic layers from being inverted when switching of the magnetized states of the MTJ element (magnetization inversion) is carried out, a given difference is provided between the coercive forces of the two ferromagnetic layers. Accordingly, only the magnetization of the ferromagnetic layer having a smaller coercive force is inverted, and the above-described parallel state and anti-parallel state can be realized.

The ferromagnetic layer having a smaller coercive force among the two ferromagnetic layers is called a memory layer (free layer), and the ferromagnetic layer having a larger coercive force is called a fixed layer (pinned layer). As a method for providing a difference between the coercive forces, for example, there are methods in which the materials are made different from each other, the volumes are made to have a difference therebetween, and the like. However, as the most general method, there is a method in which the magnetized state of the fixed layer is fixed by combining the antiferromagnetic layer with the fixed layer.

With respect to the switching of the magnetized states of the MTJ element, the writing selectivity is important. Namely, it is important that magnetization inversion on the memory layer is executed for a selected MTJ element which will be a writing object, and magnetization inversion on the memory layer is inhibited for unselected and half-selected MTJ elements which will be not writing objects.

In particular, because error writing is easily brought about with respect to a half-selected MTJ element to which only a magnetic field in the easy or the hard axial direction is applied, for the purpose of commercial using, there has been an important object that the technique of effectively preventing error writing is proposed for.

Further, on the other hand, with respect to switching of the MTJ element, there has been requested that a write current is reduced (electric current consumption-lowering) by carrying out magnetization inversion at a small switching magnetic field due to the coercive force of the memory layer being made little. However, when the coercive force of the memory layer is made little, error writing is easily brought about in a half-selected MTJ element.

BRIEF SUMMARY OF THE INVENTION

A magnetic random access memory according to an aspect of the present invention has a magneto-resistance effect element, write lines, and a strained layer which is disposed so as to correspond to the magneto-resistance effect element, and which has a function of being physically deformed at the time of data writing.

The magnetic random access memory according to an aspect of the present invention has a magneto-resistance effect element, write lines, and capacitors connected between the magneto-resistance effect element and the write lines, and a strained layer is disposed between the electrodes of the capacitors.

BRIEF DESCRIPTION OF THE SEVERAL VIEWS OF THE DRAWING

FIG. 12 is a sectional view showing a memory cell according to first to fourth embodiments of the invention;

FIG. 14 is a sectional view showing a state of an MTJ element and a strained layer at the time of writing;

DETAILED DESCRIPTION OF THE INVENTION

A magnetic random access memory of an aspect of the present invention will be described below in detail with reference to the accompanying drawings.

1. Principle of Writing Operation

First, a principle of writing operation which is a premise of a magnetic random access memory according to an aspect of the present invention will be described.

The switching magnetic field of an MTJ element at the time of data writing can be described by using a Stoner-Wohlfarth uniform rotation model.

Figure 1:
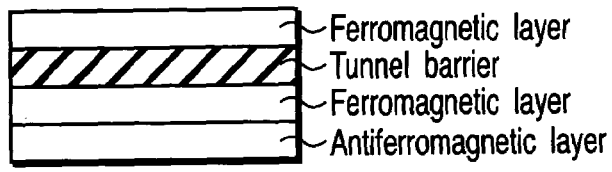
FIG. 1 is a sectional view showing a structure of an MTJ element.
Figure 2:
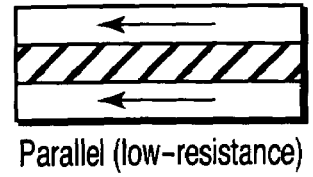
FIG. 2 is a diagram showing the MTJ element in a parallel state.
Figure 3:
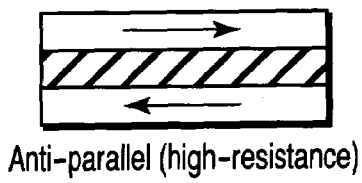
FIG. 3 is a diagram showing the MTJ element in an anti-parallel state.
Figure 4:
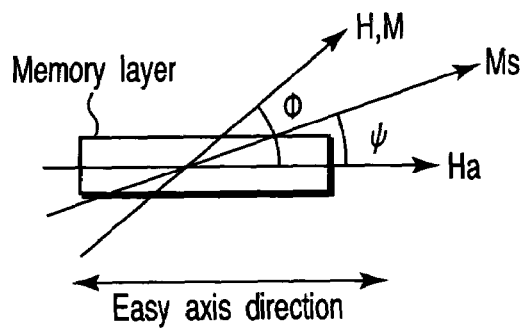
FIG. 4 is a diagram showing a relationship between a magnetic field and a magnetizing direction.

As shown in FIG. 4, suppose that, when a magnetic field H at an angle of $\phi$ with respect to an easy axis is applied to a memory layer of the MTJ element, the magnetizing direction of the memory layer of the MTJ element is rotated by an angle of $\varphi$ with respect to the easy axis. Because magnetization M is observed as a directional component of a magnetic field H of spontaneous magnetization Ms, $M = Ms \times \cos(\phi - \varphi)$.

A magnetic energy Em per unit volume is $$Em = -H \times M = -H \times Ms \times \cos(\phi - \varphi).$$

Suppose that it has the ease of axis, and an anisotropic energy Ea per unit volume is, as a first approximation, $$Ea = Ku \times (\sin \varphi)^2,$$

and a total energy E per unit volume is $$E = Ea + Em.$$

Note that $\varphi$ is determined under the condition that the total energy is made to be a minimum.

$$\partial E / \partial \varphi = Ku \times (\sin 2\varphi) - Ms \times H \times \sin(\phi - \varphi) = 0$$

$$\partial^2 E / \partial \varphi^2 = 2Ku \times \cos(2\varphi) + Ms \times H \times \cos(\phi - \varphi) > 0$$

If the magnetic field H is increased, the magnetization is inverted.

Namely, the total energy E per unit volume passes through the point of inflection.

The condition for this is $$\partial E / \partial \varphi = \partial^2 E / \partial \varphi^2 = 0.$$

Accordingly, $$\partial E/\partial\phi = 2\times Ku \times \sin\phi \times \cos\phi - Ms \times H \times (\sin\phi\cdot\cos\phi - \cos\phi\cdot\sin\phi) = 0$$

$$\partial^2 E/\partial\phi^2 = 2\times Ku \times (\cos^2\phi - \sin^2\phi) + Ms \times H \times (\cos\phi\cdot\cos\phi + \sin\phi\cdot\sin\phi) = 0.$$

Provided that $h = H \cdot Ms/(2 \cdot Ku)$, $Hx = h \cdot \cos\phi$, and $Hy = h \cdot \sin\phi$, the above-described two formulas are made to be:

$$\sin\phi\cdot\cos\phi + Hx\cdot\sin\phi - Hy\cdot\cos\phi = 0$$

$$\cos^2\phi - \sin^2\phi + Hx\cdot\cos\phi + Hy\cdot\sin\phi = 0.$$

The Hx, Hy which satisfy the two formulas are switching magnetic fields.

To calculate those, $Hx = -\cos^3\phi$, $Hy = \sin^3\phi$.

If $\phi$ is erased, $$Hx^{2/3} + Hy^{2/3} = 1.$$

Figure 5:
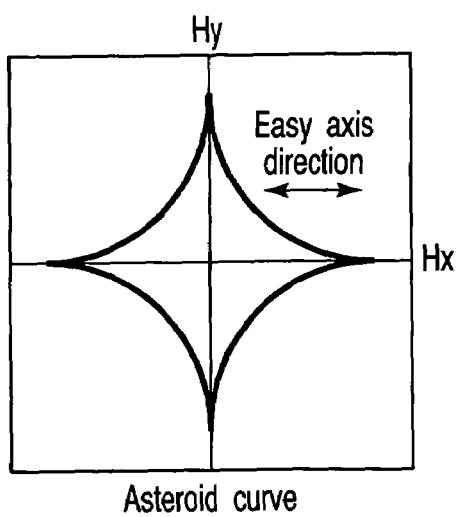
FIG. 5 is a diagram showing an example of an asteroid curve.

If the Hx, Hy are graphed, it can be an asteroid curve such as shown in FIG. 5. However, the easy axis direction is the direction of the x-axis, and the hard axis direction is the direction of the Y-axis.

It can be understood from the asteroid curve that, a magnitude of a magnetic field needed for inverting the direction of the residual magnetization of the memory layer of an MTJ element, i.e., a switching magnetic field in a case where both of the magnetic field in the easy axis direction and the magnetic field in the hard axis direction are applied to is smaller than that in as compared with a case where only a magnetic field in the easy axis direction is applied, or a case where only a magnetic field in the hard axis direction is applied.

Accordingly, by setting a magnetic field in the easy axis direction and a magnetic field in the hard axis direction to appropriate values at the time of data writing, magnetization inversion on the memory layer can be selectively generated with respect to only a selected MTJ element which will be a writing object.

Note that an MTJ element is disposed at, for example, an intersection of a write word line and a data selecting line (write bit line) which intersect each other. Namely, a magnetic field in the easy axis direction and a magnetic field in the hard axis direction are established by making a write current flow into a write word line and a data selecting line.

For example, at the time of data writing, a write current which travels in one direction is made to flow into a write word line, and a write current which travels in one direction or the other direction is made to flow into a data selecting line in accordance with a value of the written data.

When a write current which travels in one direction is made to flow into the data selecting line, the magnetized state of the MTJ element is made to be in a parallel state ("1" state). On the other hand, when a write current which travels in the other direction is made to flow into the data selecting line, the magnetized state of the MTJ element is made to be in an anti-parallel state ("0" state).

However, as follows, it is difficult to selectively carry out magnetization inversion.

Namely, with respect to the asteroid curve, there are cases in which $Heasy^{2/3} + Hhard^{2/3} = C$ (fixed) is not satisfied, and in this case, there is a high possibility that error writing is brought about with respect to the half-selected MTJ element. Here, Heasy is a value of the magnetic field in the easy axis direction, and Hhard is a value of the magnetic field in the hard axis direction.

Figure 6:
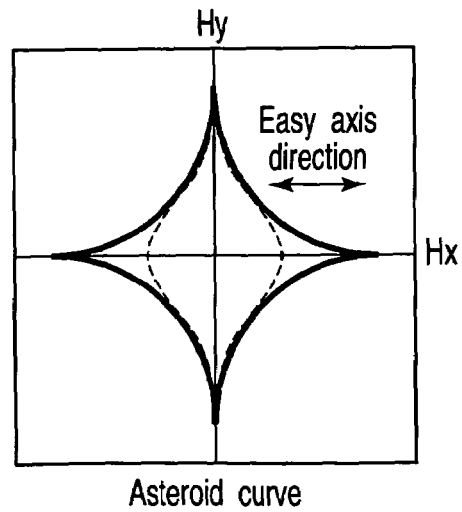
FIG. 6 is a diagram showing an example of an asteroid curve.

For example, on the asteroid curve of FIG. 6, at a region where Heasy which is the magnetic field in the easy axis direction is zero or small, a value of the switching magnetic field of the memory layer is small, and there is a high possibility that error writing is brought about with respect to the half-selected MTJ element. This is because a demagnetizing field is generated in a ferromagnetic layer due to a difference between the magnetic permeability of the ferromagnetic layer and the paramagnetic layer, and the residual magnetization at the end portion of the ferromagnetic layer is turned to a direction different from that of the residual magnetization at the inside thereof.

Due to the existence of such magnetic domains at the end portion of the ferromagnetic layer, the switching magnetic field at a region where Heasy which is the magnetic field in the easy axis direction is zero or little is less than that of the ideal asteroid curve of FIG. 5 (in a case where the directions at the inside and the end portion of the ferromagnetic layer are equal).

Figure 7:
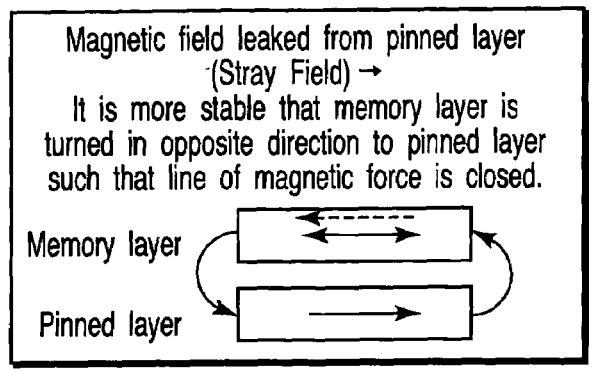
FIG. 7 is a diagram showing an example of a cause of a shift in an asteroid curve.

Further, because the difference between the magnetic permeability of the ferromagnetic layer and the paramagnetic layer is rather large, for example, as shown in FIG. 7, a line of magnetic force leaked from the fixed layer (pinned layer) is absorbed into the memory layer (free layer). Accordingly, the energy in the case where the magnetizations of the memory layer and the fixed layer have the anti-parallel relationship is made lower than the energy in the case where the both have the parallel relationship.

Figure 8:
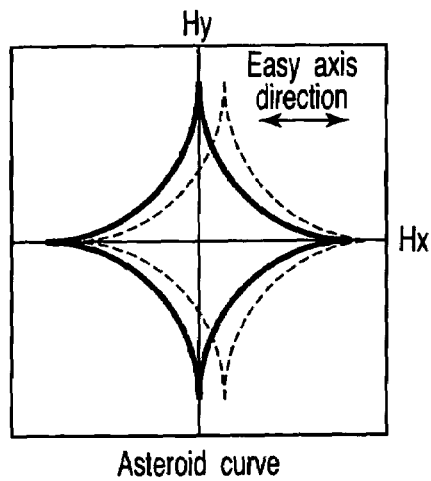
FIG. 8 is a diagram showing an example of an asteroid curve.
Figure 9:
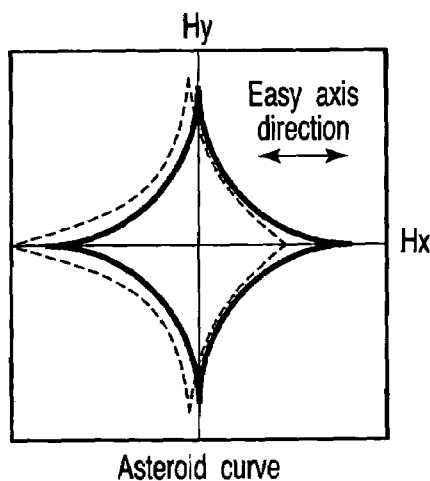
FIG. 9 is a diagram showing an example of an asteroid curve.

Therefore, the value of a switching magnetic field needed for switching the magnetized state of the memory layer from being in a parallel state to being in an anti-parallel state is made less than the value of a switching magnetic field needed for switching it from being in an anti-parallel state to being in a parallel state, and as shown in FIG. 8, the asteroid curve is shifted to the easy axis direction. Further, this shift deforms the asteroid curve as shown in FIG. 9 when a magnetic field of only a single axis in the easy axis direction is being applied, which causes the generation of error writing.

Figure 10:
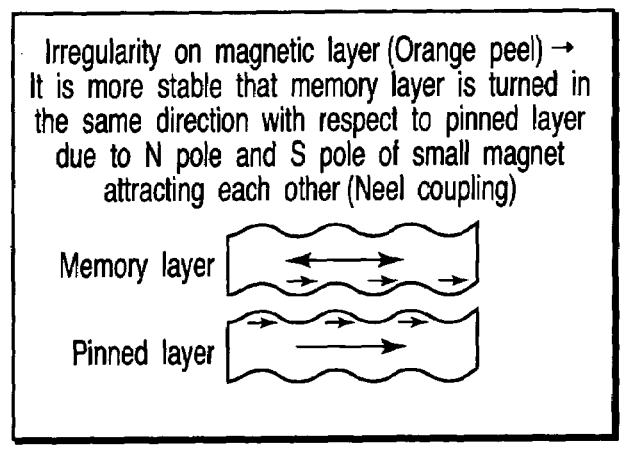
FIG. 10 is a diagram showing an example of a cause of a shift in an asteroid curve.

In addition, as shown in FIG. 10, there are cases in which the fixed layer and the memory layer are ferromagnetically combined by the irregularity on the surface of the ferromagnetic layers. In this case, the energy in the case where the magnetizations of the memory layer and the fixed layer have the parallel relationship is made less than the energy in the case where the both have the anti-parallel relationship.

Figure 11:
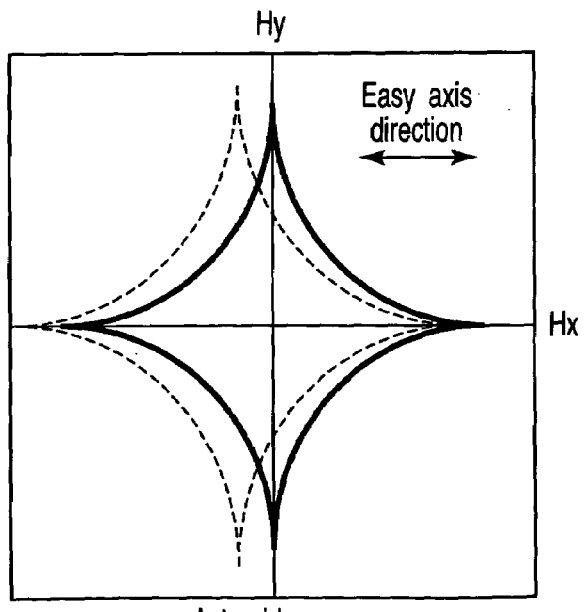
FIG. 11 is a diagram showing an example of an asteroid curve.

Accordingly, the value of a switching magnetic field needed for switching the magnetized state of the memory layer from being in an anti-parallel state to being in a parallel state is made less than the value of a switching magnetic field needed for switching it from being in a parallel state to being in an anti-parallel state, and as shown in FIG. 11, the asteroid curve is shifted to the easy axis direction. Further, this shift deforms the asteroid curve as shown in FIG. 9 when a magnetic field of only a single axis in the easy axis direction is being applied, which causes the generation of error writing.

Meanwhile, the number of the electrons which have been ferromagnetically combined at the end portion of the ferromagnetic layer is less than that at the inside thereof. Therefore, in a case where the magnitudes of the magnetic fields are the same, the end portion of the ferromagnetic layer is in a state of being more easily spin-inverted than the inside thereof.

Accordingly, it has been said that the magnetization inversion on the ferromagnetic layer makes progress from the end portion thereof. A demagnetizing field, a magnetic field leaked from the fixed layer, and the like affect the magnetic domain at the end portion of the ferromagnetic layer, and the degree of the effect depends on a shape of the end portion of the ferromagnetic layer. Therefore, there is some possibility that the magnitudes of the switching magnetic fields disperse in accordance with each MTJ element.

From the standpoint of the effect due to the ferromagnetic coupling due to the irregularity on the surface as well, the number, the position, and the like of the irregularity are not the same among all the MTJ elements. Namely, the magnetized state of the ferromagnetic layer having a lot of irregularity on the surface thereof can be easily renewed from being in an anti-parallel state to being in a parallel state. Further, when the irregularity exists at the end portion of the ferromagnetic layer, the value of the switching magnetic field cannot be sweepingly determined by being combined with the effect of the demagnetizing field.

As described above, in the magnetic random access memory, there is the problem that the characteristics of the MTJ elements (asteroid curve) disperse in accordance with each MTJ element, which brings about a deterioration in writing disturbance, i.e., the generation of error writing.

Then, in the example of the present invention, on the premise that the characteristics of the MTJ elements disperse in accordance with each MTJ element, and even if such dispersion arises, at the time of data writing, by selectively applying a stress to the memory layer of the MTJ element, or relaxing the stress, selective writing is made possible independently of the dispersion of the characteristics of the MTJ elements due to a magnetostrictive (Villari) effect.

As a method for selectively applying a stress to the memory layer of the MTJ element, or relaxing the stress, for example, a method is used in which a strained layer formed from an electrostrictive material which has a piezoelectric effect or an electrostrictive effect is disposed, as a material having an ability to be deformed under a certain condition, in the vicinity of the ferromagnetic layer of the MTJ element.

2. Outline

The example of the present invention is to realize the improvement in writing selectivity independently of the dispersion of the characteristics among the MTJ elements at the time of data writing by utilizing a magnetostrictive effect or a Villari effect of a ferromagnetic layer. As means for applying a stress to the ferromagnetic layer, a technique is used in which a strained layer formed from an electrostrictive material which has a piezoelectric effect or an electrostrictive effect is disposed, as a material having an ability to be deformed under a certain condition, in the vicinity of the ferromagnetic layer of the MTJ element.

Examples of such an electrostrictive material include BTO, PZT, PMN-PT($Pb(Mg_{1/3}Nb_{2/3})O_3$—$PbTiO_3$, $Ba(Ti, Zr)O_3$, PVDT(Polyvinylidenefloride), and the like, as an insulating material.

Further, a position at which the strained layer is disposed is, for example, in a case of 1MOST+1MTJ type memory cell formed from one transistor and one MTJ element, between the lower metal layer and the lower write line of the MTJ element. In this case, a top pin type (a type in which the memory layer is at the lower metal layer side) is preferable as the MTJ element.

In the 1MOST+1MTJ (a top pin type) type memory cell, for example, the upper write line is in ohmic contact with the antiferromagnetic layer at the fixed layer (pinned layer) side of the MTJ element via a cap layer (ohmic layer) 21. Cap layer 21 is provided between the MTJ and the data selecting line BL.

Then, at the time of data writing, a write current is made to flow into selected upper/lower write lines, and the other unselected upper/lower write lines are set to an earthing potential.

At that time, because a write current is being made to flow into the selected upper/lower write lines in the selected MTJ element, a potential difference is hardly generated between the lower metal layer and the lower write line, and there is no deformation in the strained layer disposed therebetween. Further, in order to establish such a state, it is designed such that the conductance of the upper/lower write lines is made little enough to be ignored as compared with the conductance of the driver/sinker which generates a write current.

In the half-selected MTJ element, because a write current is made to flow into one of the upper/lower write lines, and the other is set to an earthing potential, a potential difference is generated between the lower metal layer and the lower write line. The strained layer is deformed due to this potential difference, and a stress due to this deformation affects the MTJ element.

Provided that this stress is, for example, a tensile stress in the easy axis direction of the MTJ element, and a material having magnetostriction is used as the memory layer of the MTJ element, a tensile stress in the easy axis direction is generated on the memory layer of the half-selected MTJ element at the time of data writing, and the error writing tolerance is improved.

Note that, in the unselected MTJ element, because both of the upper/lower write lines thereof are set to an earthing potential, a potential difference is not generated between the lower metal layer and the lower write line, and there is no deformation in the strained layer disposed therebetween.

In this way, in accordance with the example of the present invention, at the time of data writing, only the half-selected MTJ element is made to be in a state in which it is difficult to bring about magnetization inversion by increasing spontaneous magnetization on the memory layer due to the magnetostrictive (Villari) effect. Therefore, a write current can be reduced by making the coercive force of the memory layer of the MTJ element in a state in which a stress is not applied to, and even if the coercive force of the memory layer reduced, there is no case where error writing is brought about.

Further, according to the example of the present invention, it can be thought that the depressions of the asteroid curve at the time of data writing are substantially made greater due to the error writing tolerance of the MTJ element in a half-selected state being improved.

Namely, in the state in which a magnetic field only in the easy axis direction or only in the hard axis direction is applied thereto, the switching magnetic field is great, and in the state in which both of the magnetic fields in the easy axis direction and the hard axis direction are applied thereto, the switching magnetic field is little.

Note that the strained layer may be disposed between the MTJ element and the upper write line. At that time, the lower write line may be away from the MTJ element, and may be in ohmic contact with the MTJ element.

Further, the unselected upper/lower write lines are not necessarily at an earthing potential, and may be set to any electric potential, such as a source electric potential or the like, among the electric potentials which can generate a stress.

In the example of the present invention, as described above, in addition to the case where the state is established in which it is difficult to bring about magnetization inversion by applying a stress to the half-selected MTJ element, it is possible to establish a state in which it is difficult to bring about magnetization inversion is by eliminating the stress from the half-selected MTJ element with a state in which a stress is being applied to the MTJ element being as an initial state.

In addition, in a case of using the toggle writing (Savtchenko) method, because the writing selectivity is sufficiently ensured, at the time of data writing, a state is established in which it is easy to bring about magnetization inversion by carrying out an application and a relaxation of a stress with respect to the selected MTJ. Accordingly, because only the switching magnetic field of the selected MTJ element is selectively made little, the write current can be reduced.

3. EMBODIMENTS

Hereinafter, in case of executing the example of the present invention, a plurality of embodiments which can be considered as the best will be sequentially described.

(1) First Embodiment

A first embodiment of the invention relates to a technique in which a switching magnetic field of a half-selected MTJ element is selectively made great by applying a stress to the half-selected MTJ element at the time of data writing.

A. Memory Cell

FIG. 12 shows a structure of a memory cell of a magnetic random access memory according to the first embodiment.

In the present embodiment, a 1MOST+1MTJ type memory cell formed from one transistor and one MTJ element is an object.

Element isolation regions 12 having the STI (Shallow Trench Isolation) structure are formed on a surface region of a semiconductor substrate 11. A MOS transistor serving as a read selective switch is formed within an element region surrounded by the element isolation regions 12. The gate of the MOS transistor will be served as a read word line RWL.

A drain 13A of the MOS transistor is connected to a lower metal layer 17 via contact plugs 15a, 15c, and 15e, and intermediate conductive layers 15b and 15d. Further, a source 13B of the MOS transistor is connected to a source line SL via a contact plug 16.

An MTJ element MTJ is formed on the lower metal layer 17. The MTJ element MTJ has two ferromagnetic layers 19a and 19b, and a tunnel barrier 20 disposed therebetween. One of the two ferromagnetic layers 19a and 19b becomes a memory layer (free layer), and the other one becomes a fixed layer (pinned layer).

A write word line WWL is formed at a level which is the same as that of the intermediate layer 15d, and extends in the easy axis direction of the MTJ element MTJ. A strained layer (an electrostrictive material) 18 having the ability to be deformed under a certain condition such as a piezoelectric effect or an electrostrictive effect is disposed between the write word line WWL and the lower metal layer 17.

In the present embodiment, the strained layer 18 is made of an insulating material. When the strained layer 18 is made of a material having an electrostrictive effect, $Pb(Mg_{1/3}Nb_{2/3})O_3$—$PbTiO_3$ solid solution (PMN-PT), or the like is used as the strained layer 18. Further, when the strained layer 18 is made of a material having a piezoelectric effect, $Pb(Zr, Ti)O_3$ solid solution (PZT), $BaTiO_3$ (BTO), $Ba(Ti, Zr)O_3$, Rochelle salt, PVDF (Polyvinylidenefloride) of piezoelectric polymer, or the like is used as the strained layer 18.

In the case of the present embodiment, the memory layer is made of a material having magnetostriction. Because the memory layer of the MTJ element MTJ is made to be in a state in which it is difficult to bring about magnetization inversion or in a state in which it is easy to bring about magnetization inversion due to a magnetostrictive (Villari) effect by receiving a stress from the strained layer 18, the MTJ element MTJ is preferably a top pin type in which the memory layer is disposed at a position near to the strained layer 18.

A data selecting line (write bit line) BL is formed on the MTJ element MTJ. The data selecting line BL is connected to the MTJ element MTJ, and extends to the hard axis direction of the MTJ element MTJ.

B. Memory Cell Array

Figure 13:
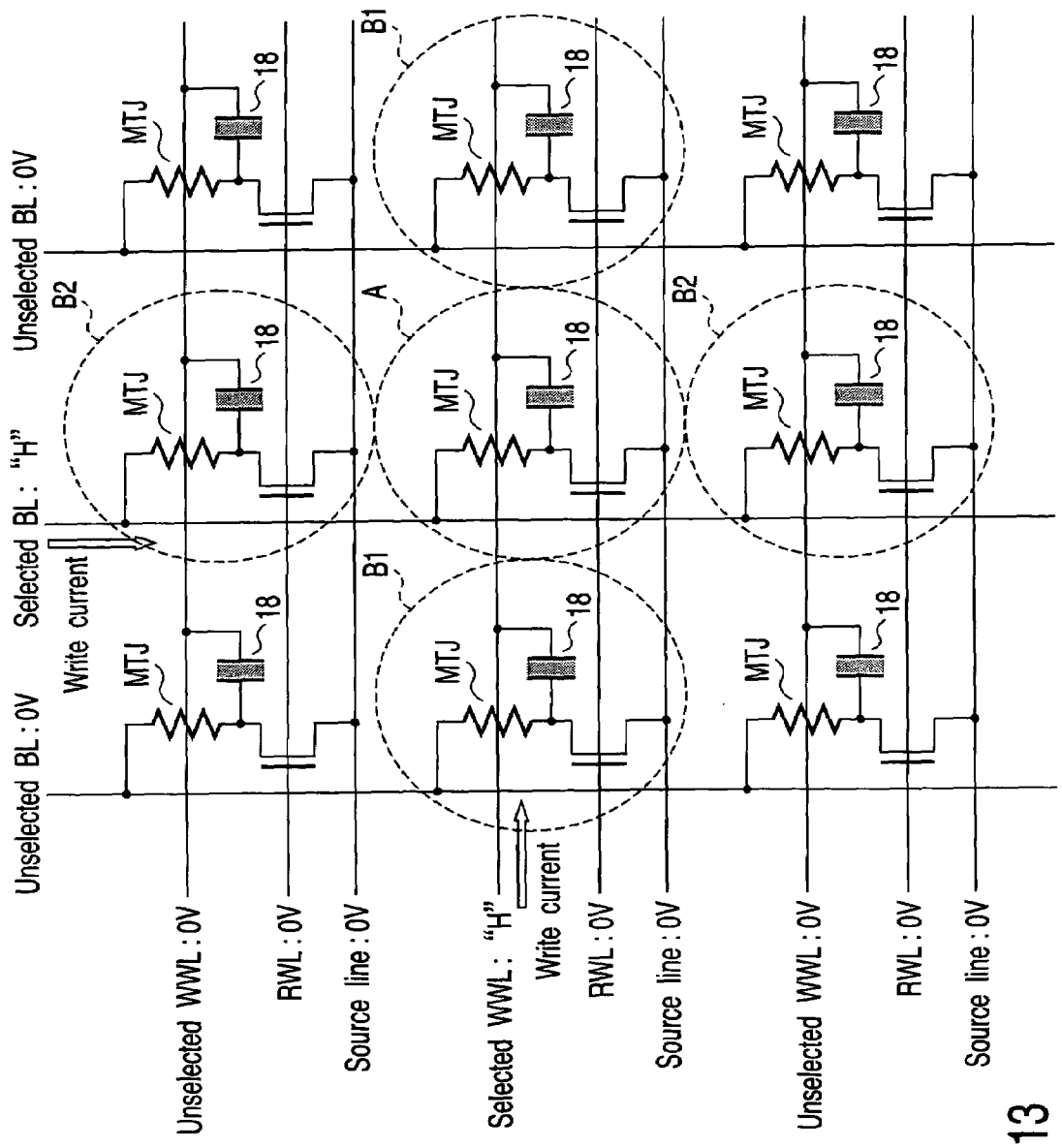
FIG. 13 is a circuit diagram showing a memory cell array according to the first to fourth embodiments.

FIG. 13 shows an equivalent circuit diagram of a memory cell array configured by using the memory cell of FIG. 12.

The feature of the memory cell array of the present embodiment is that the strained layer (insulating material) 18 is disposed between one end of the MTJ element MTJ and the write word line WWL in the 1MOST-1MTJ type memory cell array.

A capacitor is formed from the lower metal layer at the one end of the MTJ element MTJ, the write word line WWL, and the strained layer 18. Due to a potential difference being generated between the capacitors, the strained layer 18 extends or shrinks in a direction of applying a voltage, and an application or a relaxation of a stress with respect to an MTJ element MTJ is executed.

C. Principle of Writing

Next, the principle of writing which aims at improving writing selectivity will be described with reference to the memory cell array of FIG. 13.

In the present embodiment, in order to improve the writing selectivity, an anisotropic energy due to a magnetostrictive effect is utilized. The magnetostriction is a slight deformation generated when a ferromagnetic substance is magnetized. Further, in the embodiment, a Villari effect that spontaneous magnetization is increased by applying a tensile stress in a magnetizing direction is utilized.

By utilizing these effects at the time of data writing, the writing selectivity is improved, and the depressions of the asteroid curve are made large apparently.

Here, in the following description, suppose that the magnetostriction constant and the electrostriction constant are respectively positive values. Further, suppose that the strained layer (insulating material) extends in a direction of applying a voltage due to a piezoelectric effect or an electrostrictive effect.

Further, suppose that the strained layer has a shape so as to apply a tensile stress in the easy axis direction to the memory layer of the MTJ element, for example, a quadrangle, and it is the shape in which the sides in the hard axis direction are the same as or longer than the short sides of the MTJ element (the sides in the hard axis direction), and the sides in the easy axis direction are shorter than the long sides of the MTJ element (the sides in the easy axis direction).

Suppose that the memory layer of the MTJ element is formed such that the spontaneous magnetization is increased due to a tensile stress in the easy axis direction.

First, a write current is respectively made to flow into a selected write word line (selected WWL) and a selected data selecting line (selected BL), and the other unselected write word lines (unselected WWLs) and unselected data selecting lines (unselected BLs) are set to an earthing potential.

Because the data selecting line is in ohmic contact with the MTJ element MTJ, the capacitor formed from the lower metal layer at the one end of the MTJ element MTJ, the write word line, and the strained layer disposed therebetween is charged.

Figure 15:
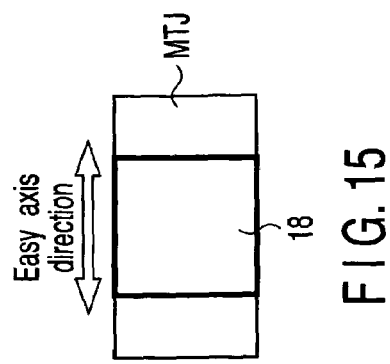
FIG. 15 is a plan view showing a state of the MTJ element at the time of writing.

At that time, because the selected MTJ element MTJ existing in the region enclosed with the broken line A is disposed between the selected write word line (selected WWL) and the selected data selecting line (selected BL), as shown in FIGS. 14 and 15, a potential difference is hardly generated between the lower metal layer 17 and the write word line WWL, and there is no deformation in the strained layer 18 disposed therebetween.

Further, in order to establish such a state, it is designed such that the conductance of the write word line WWL and the data selecting line BL are made little enough to be ignored as compared with the conductance of the driver/sinker which generates a write current.

In contrast thereto, the half-selected MTJ elements MTJs existing in the regions enclosed with the broken lines B1 are disposed between the selected write word lines (selected WWLs) and the unselected data selecting lines (unselected BLs), and the half-selected MTJ elements MTJs existing in the region enclosed with the broken lines B2 are disposed between the unselected write word lines (unselected WWLs) and the selected data selecting lines (selected BLs).

Figure 16:
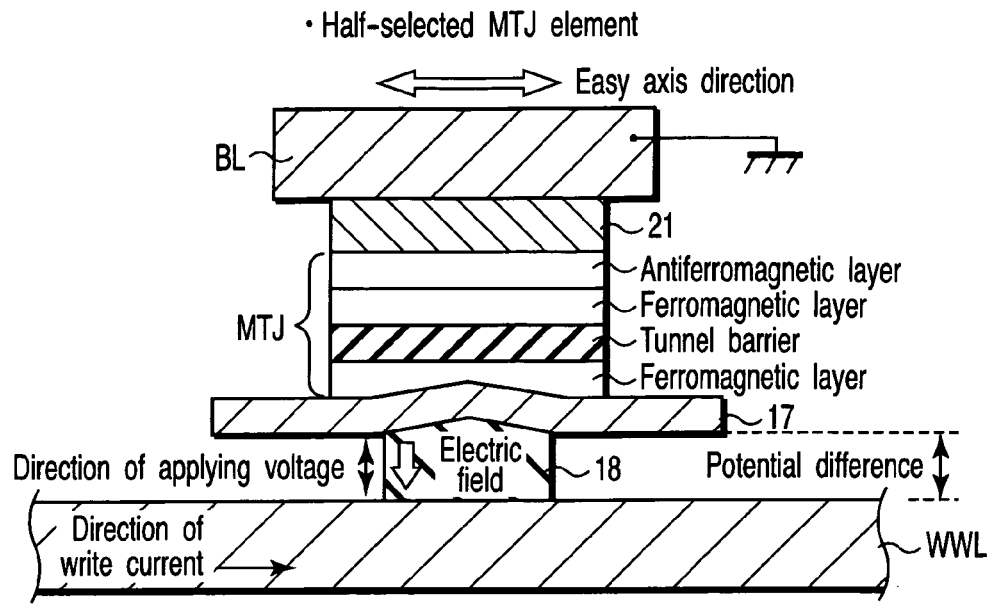
FIG. 16 is a sectional view showing a state of the MTJ element and the strained layer at the time of writing.
Figure 17:
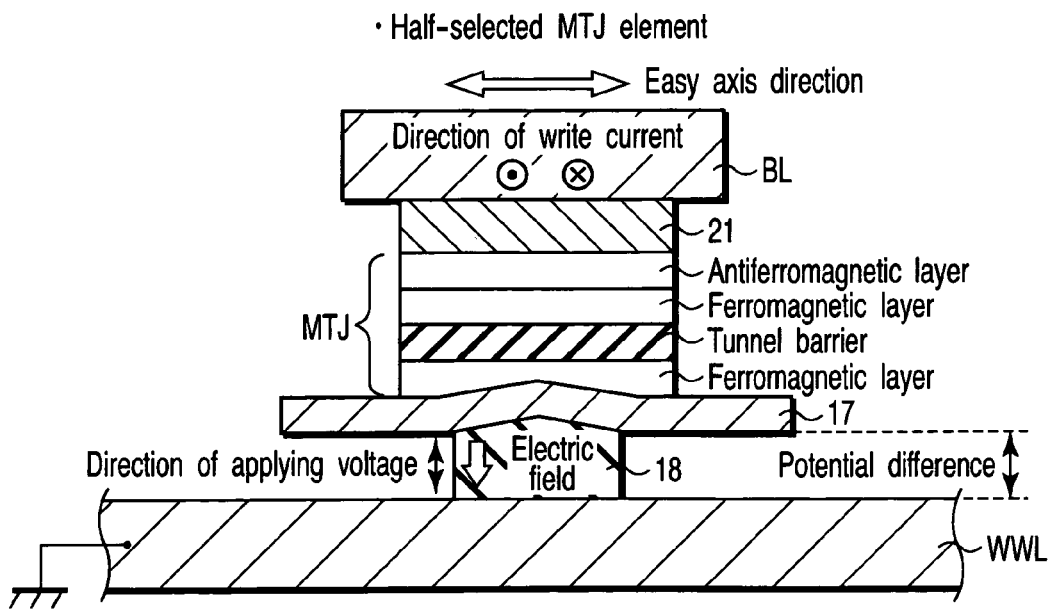
FIG. 17 is a sectional view showing a state of the MTJ element and the strained layer at the time of writing.
Figure 18:
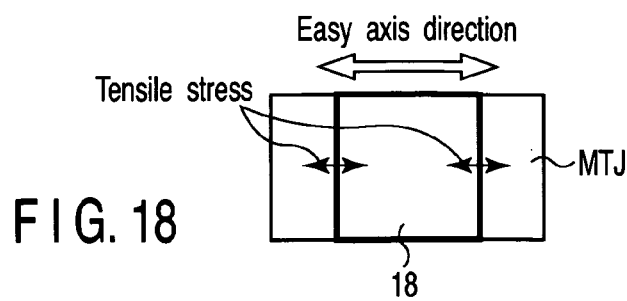
FIG. 18 is a plan view showing a state of the MTJ element at the time of writing.

Therefore, as shown in FIGS. 16 to 18, a potential difference is generated between the lower metal layer 17 and the write word line WWL. Because the strained layer 18 extends in a direction of applying a voltage due to this potential difference, a tensile stress is applied in the easy axis direction to the half-selected MTJ element MTJ.

Because a Villari effect in which the spontaneous magnetization on the memory layer of the half-selected MTJ element MTJ is increased is generated due to the tensile stress in the easy axis direction, and the switching magnetic field is increased, the error writing tolerance is improved.

By the way, because the unselected MTJ element MTJ which is not enclosed with any of the broken lines A, B1, and B2 is disposed between the unselected write word line (unselected WWL) and the unselected data selecting line (unselected BL) which have been set to an earthing potential, in the same way as the selected MTJ element MTJ, as shown in FIGS. 14 and 15, there is no case where a potential difference is generated between the lower metal layer 17 and the write word line WWL, and there is no deformation in the strained layer 18 disposed therebetween.

In this way, according to the first embodiment, a state is established in which it is difficult to bring about magnetization inversion by increasing the spontaneous magnetization on the memory layer due to a magnetostrictive effect with respect to only the half-selected MTJ elements MTJs at the time of data writing. Therefore, the coercive forces of the memory layers of the MTJ elements in a state in which a stress is not being applied are made little, and the write current can be reduced, and even if the coercive forces of the memory layers are made little, there is no case where error writing is brought about.

(2) Second Embodiment

In the first embodiment described above, a state is established in which it is difficult to bring about magnetization inversion by applying a stress to the half-selected MTJ element MTJ.

In a second embodiment of the invention, with a state in which a stress is being applied to the MTJ element MTJ being as an initial state, the magnetization inversion on the half-selected MTJ element is selectively made great by eliminating the stress from the half-selected MTJ element MTJ.

A. Memory Cell

A structure of a memory cell of a magnetic random access memory according to the second embodiment is as shown in FIG. 12, and because this is the same as in the above-described first embodiment, here, description thereof will be omitted.

B. Memory Cell Array

Because the memory cell array of the magnetic random access memory according to the second embodiment is, as shown in FIG. 12, the same as in the above-described first embodiment, here, description thereof will be omitted.

C. Principle of Writing

Next, a principle of writing according to the second embodiment will be described with reference to the memory cell array of FIG. 13.

In the following description, suppose that the magnetostriction constant and the electrostriction constant are respectively positive values. Further, suppose that the strained layer (insulating material) extends in a direction of applying a voltage due to a piezoelectric effect or an electrostrictive effect. Suppose that the strained layer has a shape so as to apply a tensile stress in the hard axis direction with respect to the memory layer of the MTJ element, for example, a quadrangle, and it is the shape in which the sides in the easy axis direction are the same as or longer than the long sides of the MTJ element (the sides in the easy axis direction), and the sides in the hard axis direction are shorter than the short sides of the MTJ element (the sides in the hard axis direction).

Suppose that the memory layer of the MTJ element is configured such that the spontaneous magnetization is reduced due to the tensile stress in the hard axis direction.

Figure 19:
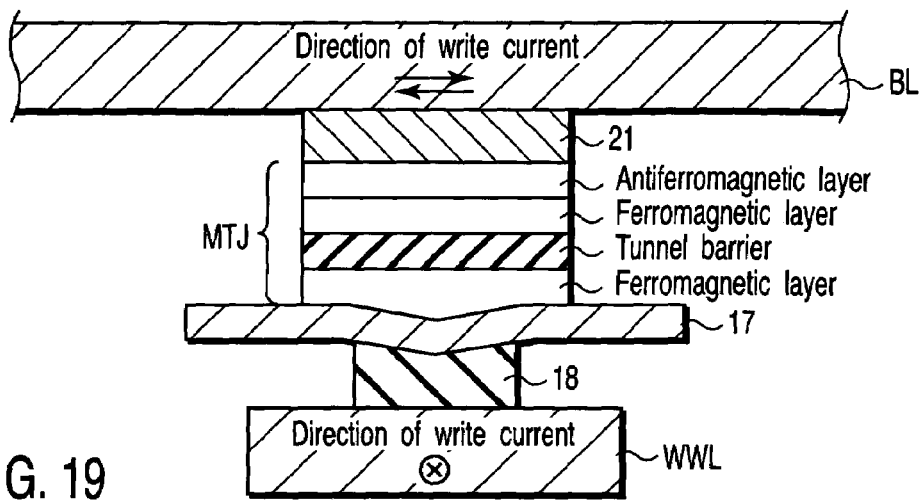
FIG. 19 is a sectional view showing a state of the MTJ element and the strained layer at the time of writing.
Figure 20:
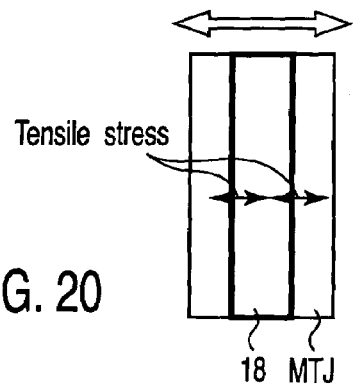
FIG. 20 is a plan view showing a state of the MTJ element at the time of writing.

Here, in the principle of writing of the present embodiment, as shown in FIGS. 19 and 20, suppose that a tensile stress has been applied in the hard axis direction to the MTJ element MTJ in advance of data writing, and a state has been established in which it is easy to reverse magnetization.

First, a write current is respectively made to flow into a selected write word line (selected WWL) and a selected data selecting line (selected BL), and the other unselected write word lines (unselected WWLs) and unselected data selecting lines (unselected BLs) are set to an earthing potential.

Because the data selecting line is in ohmic contact with the MTJ element MTJ, the capacitor formed from the lower metal layer at the one end of the MTJ element MTJ, the write word line, and the strained layer disposed therebetween is charged.

At that time, because the selected MTJ element MTJ existing in the region enclosed with the broken line A is disposed between the selected write word line (selected WWL) and the selected data selecting line (selected BL), a potential difference is hardly generated between the lower metal layer 17 and the write word line WWL, and there is no deformation in the strained layer 18 disposed therebetween.

Namely, because the selected MTJ element MTJ continues to maintain the states of FIGS. 19 and 20, the state in which it is easy to invert magnetization is maintained as is.

Further, in order to establish such a state, it is designed such that the conductance of the write word line WWL and the data selecting line BL are made little enough to be ignored as compared with the conductance of the driver/sinker which generates a write current.

In contrast thereto, the half-selected MTJ element MTJ existing in the region enclosed with the broken line B1 is disposed between the selected write word line (selected WWL) and the unselected data selecting line (unselected BL), and the half-selected MTJ element MTJ existing in the region enclosed with the broken line B2 is disposed between the unselected write word line (unselected WWL) and the selected data selecting line (selected BL).

Figure 21:
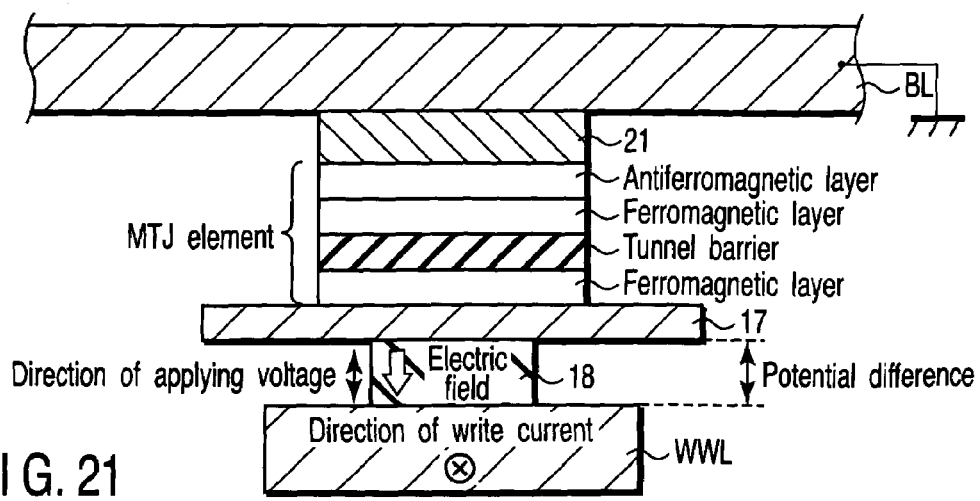
FIG. 21 is a sectional view showing a state of the MTJ element and the strained layer at the time of writing.
Figure 22:
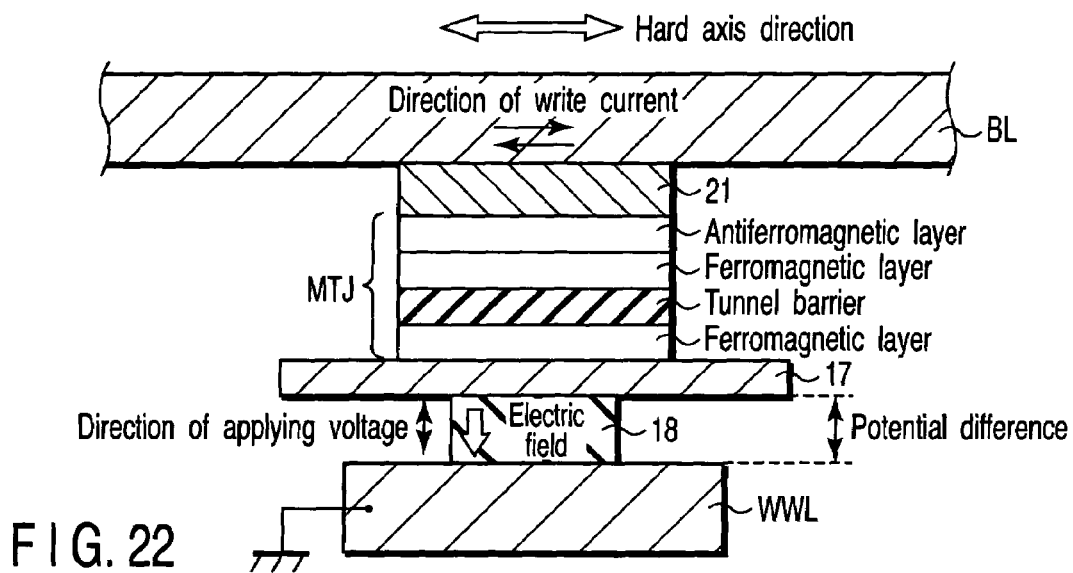
FIG. 22 is a sectional view showing a state of the MTJ element and the strained layer at the time of writing.
Figure 23:
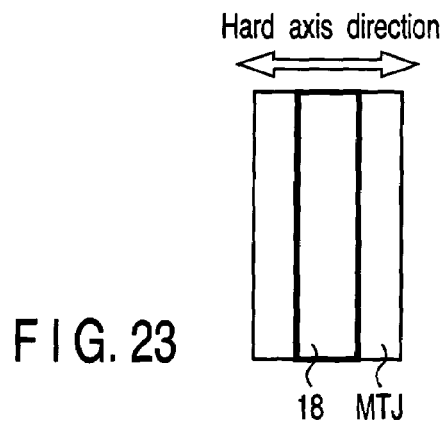
FIG. 23 is a plan view showing a state of the MTJ element at the time of writing.

Therefore, as shown in FIGS. 21 to 23, a potential difference is generated between the lower metal layer 17 and the write word line WWL. Because the strained layer 18 extends in a direction of applying a voltage due to this potential difference, the tensile stress in the hard axis direction is relaxed from the half-selected MTJ element MTJ.

Accordingly, the half-selected MTJ element MTJ is changed from being in a state in which it is easy to invert magnetization to being in a state in which it is difficult to invert magnetization, and the error writing tolerance is improved.

By the way, because the unselected MTJ element MTJ which has not been enclosed with any of the broken lines A, B1, and B2 is disposed between the unselected write word line (unselected WWL) and the unselected data selecting line (unselected BL) which have been set to an earthing potential, in the same way as the selected MTJ element MTJ, as shown in FIGS. 19 and 20, there is no case where a potential difference is generated between the lower metal layer 17 and the write word line WWL, and there is no deformation in the strained layer 18 disposed therebetween.

In this way, in accordance with the second embodiment, a state is established in which it is difficult to bring about magnetization inversion with respect to only the half-selected MTJ element MTJ by relaxing the tensile stress in the hard axis direction at the time of data writing. Therefore, the coercive force of the memory layer of the MTJ element MTJ in an initial state in which a tensile stress is applied in the hard axis direction is made little, and the write current can be reduced. In addition, even if the coercive force of the memory layer is made little, there is no case where error writing is brought about.

(3) Third Embodiment

A third embodiment of the invention relates to the toggle writing (Savtchenko) method disclosed in, for example, U.S. Pat. No. 6,545,960 and [M. Durlam, et. al., "A 0.18 µm 4 Mb Toggling MRAM" IEDM2003 Technical Digest, pp. 995–997, December 2003].

The toggle writing method has been known as a writing method in which the writing selectivity is high and it is difficult to bring about error writing. However, there is the problem that a switching magnetic field, i.e., a switching magnetic field needed for inverting a magnetized state of a selected MTJ element which will be a writing object is great.

Then, due to the example of the present invention being applied to the toggle writing method, the switching magnetic field is made little while maintaining the writing selectivity, and an attempt is made to lower an electric current consumption by reducing a write current.

A. Memory Cell

A structure of a memory cell of a magnetic random access memory according to the third embodiment is as shown in FIG. 12, and because this is the same as in the above-described first embodiment, here, description thereof will be omitted.

B. Memory Cell Array

Because the memory cell array of the magnetic random access memory according to the third embodiment is, as shown in FIG. 13, the same as in the above-described first embodiment, here, description thereof will be omitted.

C. Principle of Writing

In the toggle writing method, because the improvement in the writing selectivity can be realized, and the problem on error writing can be solved, here, a proposal for a technique of making data easy to be written into the selected MTJ element due to the example of the present invention being applied thereto is made.

Figure 24:
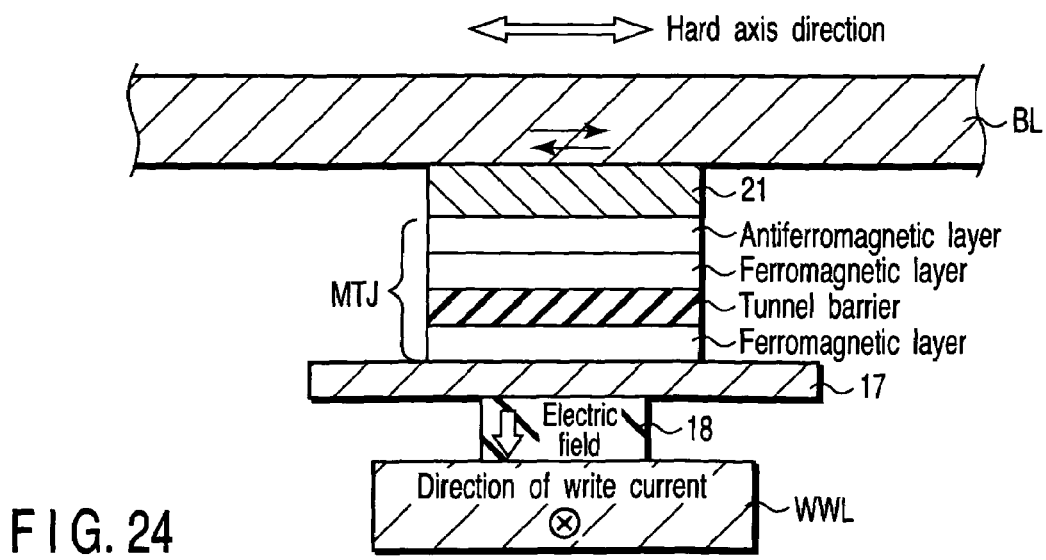
FIG. 24 is a sectional view showing a state of an MTJ element and a strained layer at the time of the toggle writing.
Figure 25:
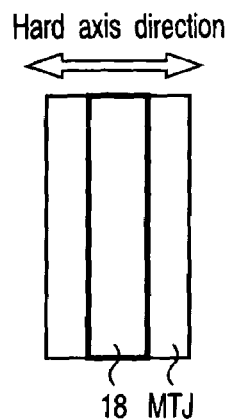
FIG. 25 is a plan view showing a state of the MTJ element at the time of toggle writing.

As shown in FIGS. 24 and 25, in advance of data writing, the strained layer 18 is deformed, and a tensile stress is not applied to the MTJ element MTJ.

First, a write current is made to flow into a selected write word line (selected WWL), and other unselected write word lines (unselected WWLs) and all the data selecting lines (selected/unselected BLs) are set to an earthing potential.

Figure 26:
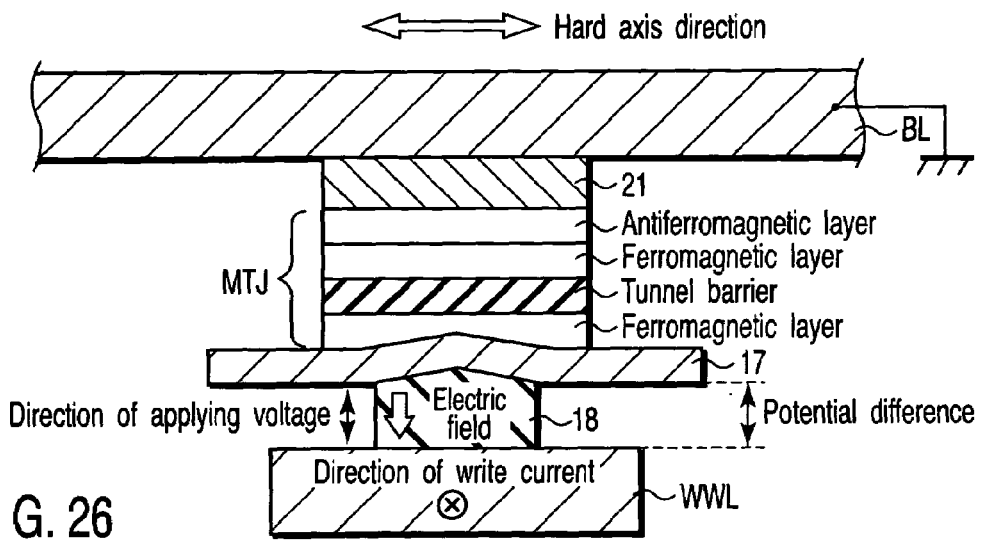
FIG. 26 is a sectional view showing a state of the MTJ element and the strained layer at the time of the toggle writing.
Figure 29:
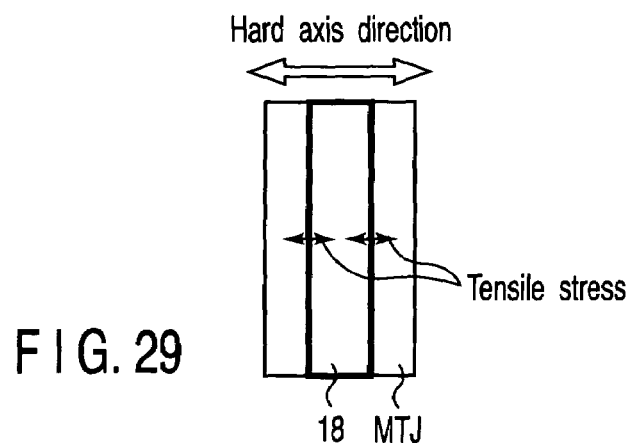
FIG. 29 is a plan view showing a state of the MTJ element at the time of the toggle writing.

At that time, because the selected MTJ element MTJ existing in the region enclosed with the broken line A is disposed between the selected write word line (selected WWL) and the selected data selecting line (selected BL), as shown in FIGS. 26 and 29, a potential difference is generated between the lower metal layer 17 and the write word line WWL.

Because the strained layer 18 extends in a direction of applying a voltage due to this potential difference, a tensile stress is applied in the hard axis direction to the selected MTJ element MTJ.

Because the spontaneous magnetization on the memory layer of the selected MTJ element MTJ is reduced due to the tensile stress in the hard axis direction, and a switching magnetic field is made little, it is easy to carry out data writing with respect to the selected MTJ element MTJ.

Further, in order to establish such a state, it is designed such that the conductance of the write word line WWL and the data selecting line BL are made little enough to be ignored as compared with the conductance of the driver/sinker which generates a write current.

Next, while making a write current flow into the selected write word line (selected WWL), a write current is further made to flow into the selected data selecting line (selected BL). In addition, the other unselected write word lines (unselected WWLs) and unselected data selecting lines (unselected BLs) are set to an earthing potential.

Figure 27:
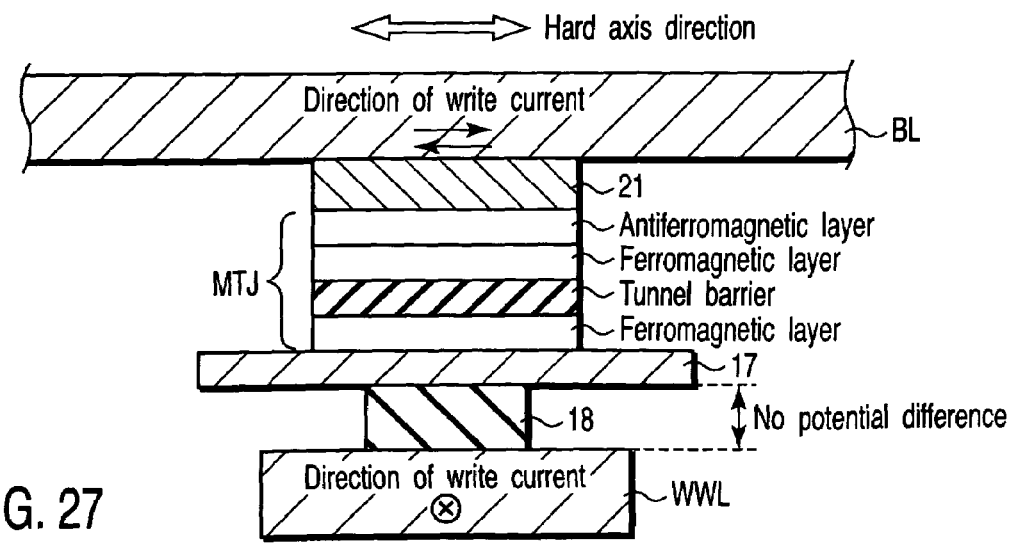
FIG. 27 is a sectional view showing a state of the MTJ element and the strained layer at the time of the toggle writing.

At that time, with respect to the selected MTJ element MTJ existing in the region enclosed with the broken line A, as shown in FIG. 27, a potential difference is not generated between the lower metal layer 17 and the write word line WWL.

Next, the write current flowing into the selected write word line (selected WWL) is cut off, and a write current is made to flow into only the selected data selecting line (selected BL). Namely, all the write word lines (selected/unselected WWLs) and the unselected data selecting lines (unselected BLs) other than the selected data selecting line (selected BL) are set to an earthing potential.

Figure 28:
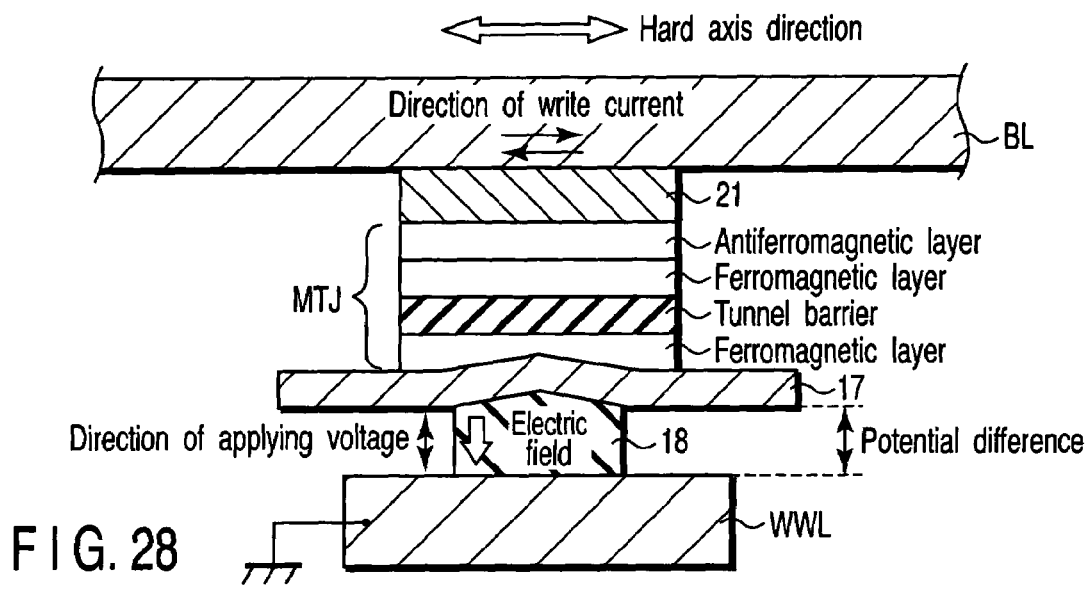
FIG. 28 is a sectional view showing a state of the MTJ element and the strained layer at the time of the toggle writing.

At that time, because the selected MTJ element MTJ existing in the region enclosed with the broken line A is disposed between the selected write word line (selected WWL) and the selected data selecting line (selected BL), as shown in FIGS. 28 and 29, a potential difference is generated between the lower metal layer 17 and the write word line WWL.

Because the strained layer 18 extends in a direction of applying a voltage due to this potential difference, a tensile stress is applied in the hard axis direction to the selected MTJ element MTJ.

Because the spontaneous magnetization on the memory layer of the selected MTJ element MTJ is reduced due to the tensile stress in the hard axis direction, the magnetization of the selected MTJ element MTJ is easy to become stable.

Further, in order to establish such a state, it is designed such that the conductance of the write word line WWL and the data selecting line BL are made little enough to be ignored as compared with the conductance of the driver/sinker which generates a write current.

In this way, according to the third embodiment, a state is established in which it is easy to bring about magnetization inversion with respect to the half-selected MTJ element MTJ by reducing the spontaneous magnetization due to a magnetostrictive effect at the time of data writing. Therefore, in the toggle writing method in which the writing selectivity is high, the switching magnetic field is further made little, and a write current can be reduced.

(4) Fourth Embodiment

In the third embodiment, a state is established in which it is easy to bring about magnetization inversion by applying a stress to the selected MTJ element MTJ in the toggle writing method.

In a fourth embodiment of the invention, with the state in which a stress is being applied to the MTJ element MTJ, a state is established in which it is easy to bring about magnetization inversion by eliminating the stress from the selected MTJ element MTJ in the toggle writing method.

A. Memory Cell

A structure of a memory cell of a magnetic random access memory according to the fourth embodiment is as shown in FIG. 12, and because this is the same as in the above-described first embodiment, here, description thereof will be omitted.

B. Memory Cell Array

Because the memory cell array of the magnetic random access memory according to the fourth embodiment is, as shown in FIG. 13, the same as in the above-described first embodiment, here, description thereof will be omitted.

C. Principle of Writing

Figure 30:
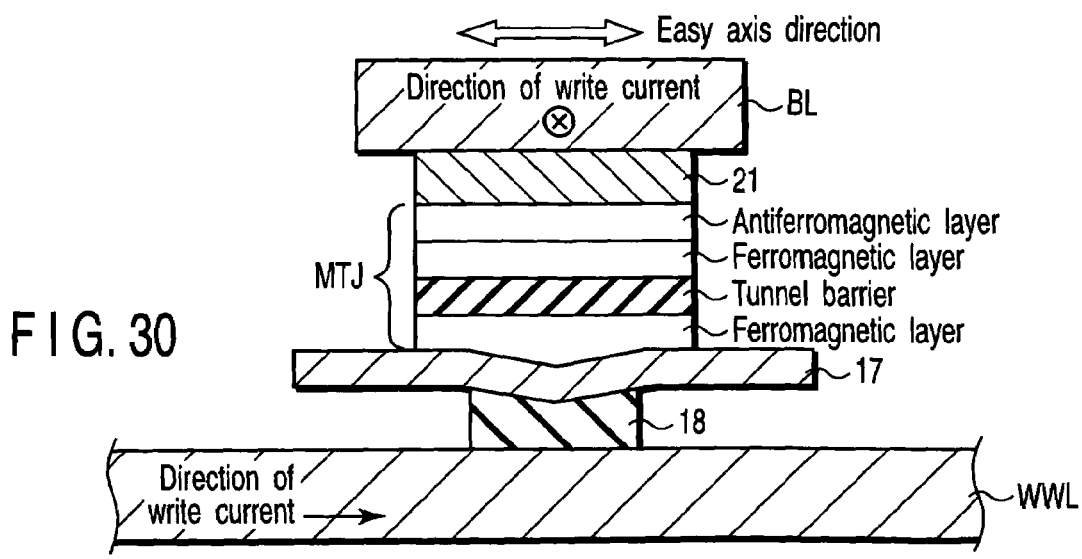
FIG. 30 is a sectional view showing a state of the MTJ element and the strained layer at the time of the toggle writing.
Figure 31:
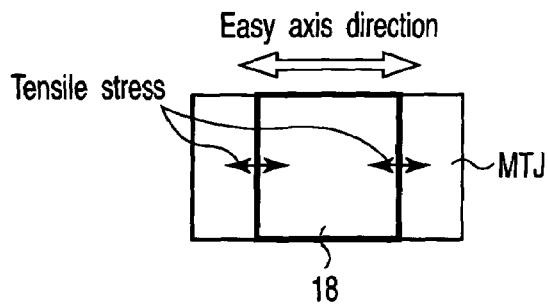
FIG. 31 is a plan view showing a state of the MTJ element at the time of the toggle writing.

In a principle of writing of the present embodiment, as shown in FIGS. 30 and 31, suppose that a tensile stress is applied in the easy axis direction with respect to the MTJ element MTJ in advance of data writing.

First, a write current is made to flow into a selected write word line (selected WWL), and other unselected write word lines (unselected WWLs) and all the data selecting lines (selected/unselected BLs) are set to an earthing potential.

Figure 32:
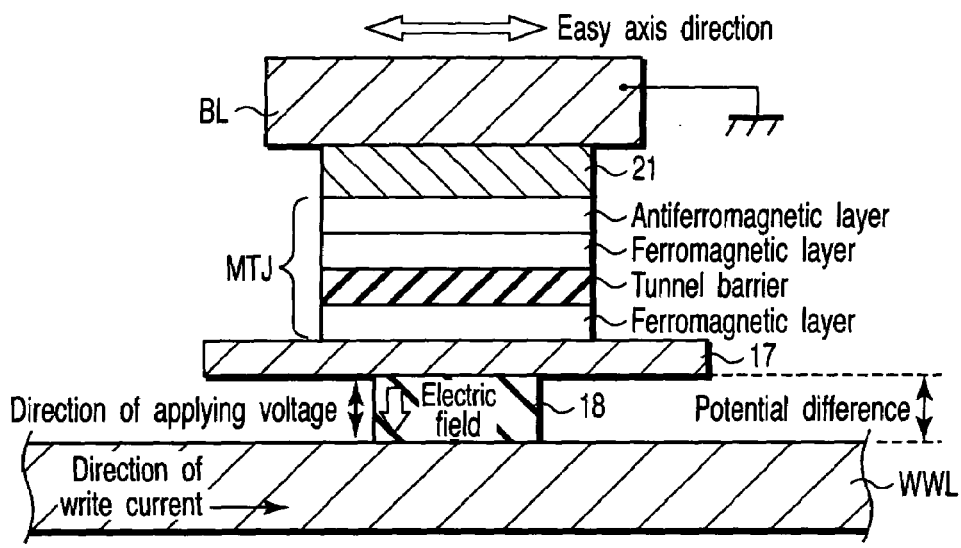
FIG. 32 is a sectional view showing a state of the MTJ element and the strained layer at the time of the toggle writing.
Figure 35:
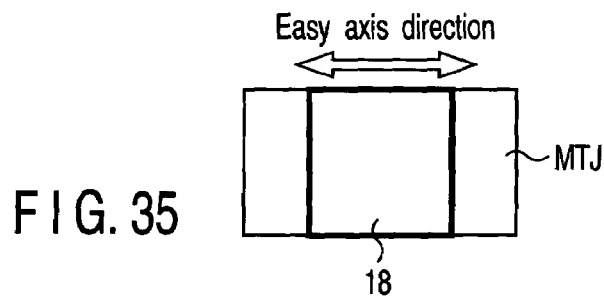
FIG. 35 is a plan view showing a state of the MTJ element at the time of the toggle writing.

At that time, because the selected MTJ element MTJ existing in the region enclosed with the broken line A is disposed between the selected write word line (selected WWL) and the selected data selecting line (selected BL), as shown in FIGS. 32 and 35, a potential difference is generated between the lower metal layer 17 and the write word line WWL.

Because the strained layer 18 extends in a direction of applying a voltage due to this potential difference, the tensile stress which has been applied in the easy axis direction is relaxed from the selected MTJ element MTJ.

Because the spontaneous magnetization on the memory layer of the selected MTJ element MTJ is reduced due to the relaxation of the tensile stress in the easy axis direction, and a switching magnetic field is made little, it is easy to carry out data writing with respect to the selected MTJ element MTJ.

Further, in order to establish such a state, it is designed such that the conductance of the write word line WWL and the data selecting line BL are made little enough to be ignored as compared with the conductance of the driver/sinker which generates a write current.

Next, while making a write current flow into the selected write word line (selected WWL), a write current is further made to flow into the selected data selecting line (selected BL). In addition, the other unselected write word lines (unselected WWLs) and the unselected data selecting lines (unselected BLs) are set to an earthing potential.

Figure 33:
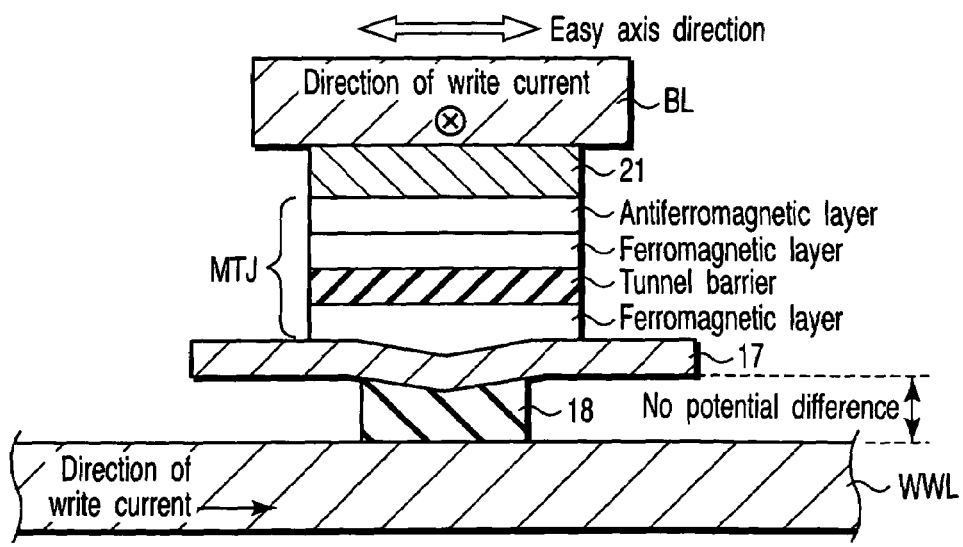
FIG. 33 is a sectional view showing a state of the MTJ element and the strained layer at the time of the toggle writing.

At that time, with respect to the selected MTJ element MTJ existing in the region enclosed with the broken line A, as shown in FIG. 33, a potential difference is not generated between the lower metal layer 17 and the write word line WWL.

Next, the write current flowing into the selected write word line (selected WWL) is cut off, and a write current is made to flow into only the selected data selecting line (selected BL). Namely, all the write word lines (selected/unselected WWLs) and the unselected data selecting lines (unselected BLs) other than the selected data selecting line (selected BL) are set to an earthing potential.

Figure 34:
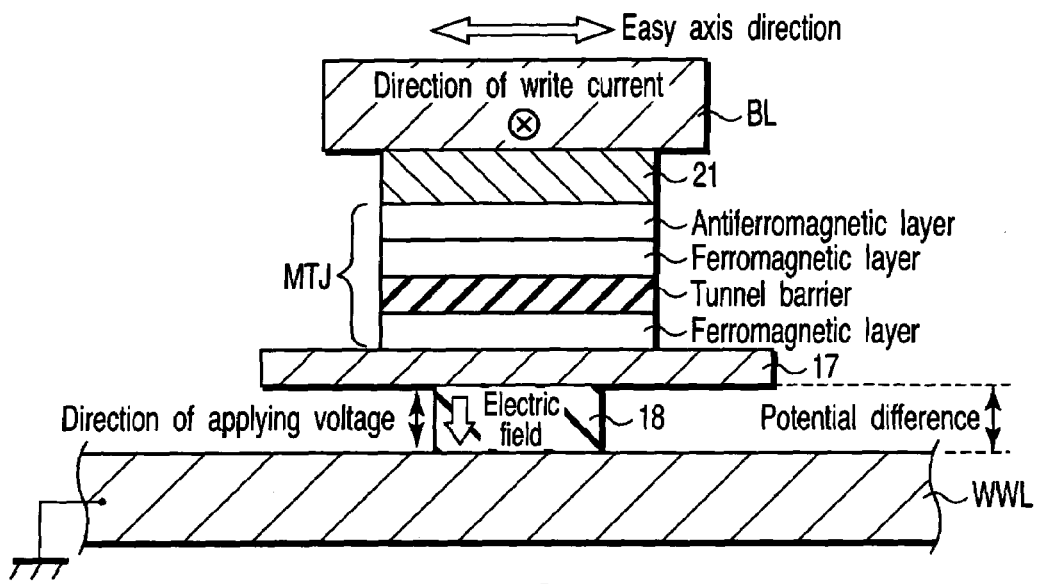
FIG. 34 is a sectional view showing a state of the MTJ element and the strained layer at the time of the toggle writing.

At that time, because the selected MTJ element MTJ existing in the region enclosed with the broken line A is disposed between the selected write word line (selected WWL) and the selected data selecting line (selected BL), as shown in FIGS. 34 and 35, a potential difference is generated between the lower metal layer 17 and the write word line WWL.

Because the strained layer 18 extends in a direction of applying a voltage due to this potential difference, the tensile stress which has been applied in the easy axis direction is relaxed from the selected MTJ element MTJ.

Because the spontaneous magnetization on the memory layer of the selected MTJ element MTJ is reduced due to the relaxation of the tensile stress in the easy axis direction, the magnetization of the selected MTJ element MTJ is easy to become stable.

Further, in order to establish such a state, it is designed such that the conductance of the write word line WWL and the data selecting line BL are made little enough to be ignored as compared with the conductance of the driver/sinker which generates a write current.

In this way, according to the fourth embodiment, a state is established in which it is easy to bring about magnetization inversion with respect to the selected MTJ element MTJ by reducing the spontaneous magnetization on the memory layer due to a magnetostrictive effect at the time of data writing. Therefore, in the toggle writing method in which the writing selectivity is high, a switching magnetic field is further made little, and a write current can be reduced.

(5) Fifth Embodiment

A fifth embodiment of the invention as well relates to the toggle writing method. In the fifth embodiment, a stress is applied with respect to the MTJ element from the upper and lower directions due to strained layers being disposed at the upper portion and the lower portion of an MTJ element.

A. Memory Cell

Figure 36:
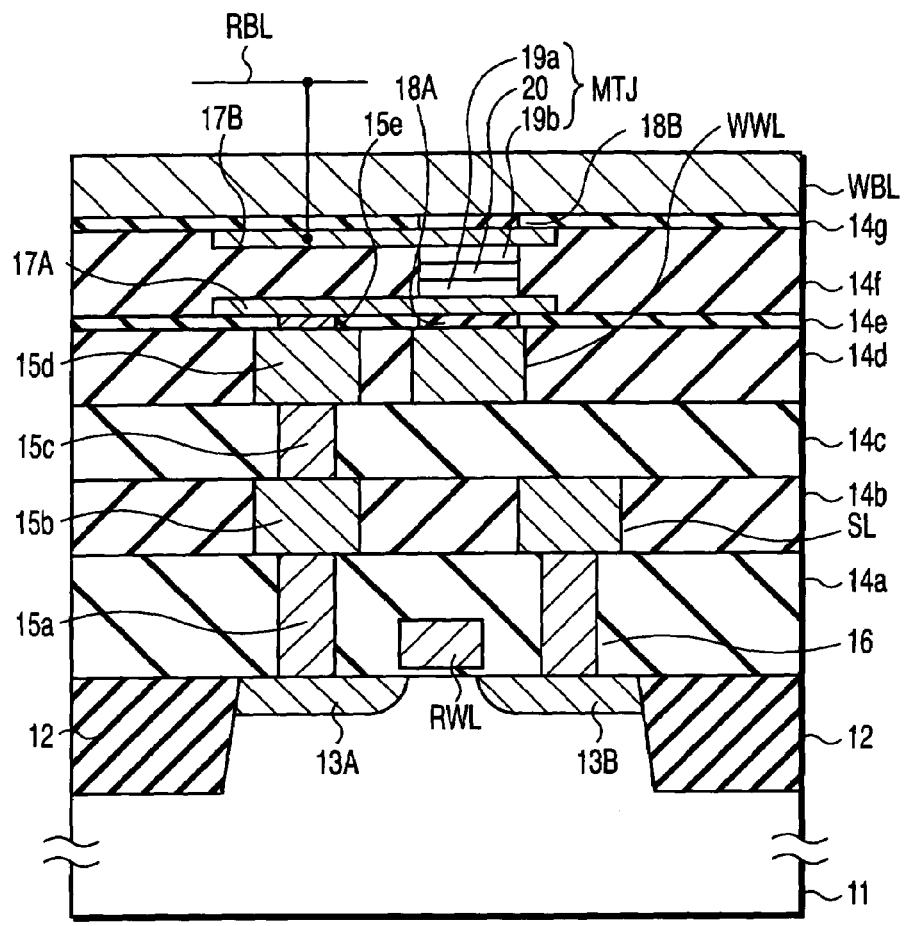
FIG. 36 is a sectional view showing a memory cell according to a fifth embodiment of the invention.

FIG. 36 shows a structure of a memory cell of a magnetic random access memory according to the fifth embodiment.

In the present embodiment, a 1MOST+1MTJ type memory cell formed from one transistor and one MTJ element is used as an object.

The element isolation regions 12 having the STI (Shallow Trench Isolation) structure are formed on the surface region of the semiconductor substrate 11. A MOS transistor serving as a read selective switch is formed within an element region surrounded by the element isolation regions 12. The gate of the MOS transistor will be served as a read word line RWL.

The drain 13A of the MOS transistor is connected to a lower metal layer 17A via the contact plugs 15a, 15c, and 15e, and intermediate layers 15b and 15d. Further, the source 13B of the MOS transistor is connected to the source line SL via the contact plug 16.

An MTJ element MTJ is formed on the lower metal layer 17A. The MTJ element MTJ has the two ferromagnetic layers 19a and 19b, and the tunnel barrier 20 disposed therebetween. One of the two ferromagnetic layers 19a and 19b becomes a memory layer (free layer), and the other one becomes a fixed layer (pinned layer).

The write word line WWL is formed at a level which is the same as that of the intermediate layer 15d, and extends in the easy axis direction of the MTJ element MTJ. A strained layer 18A having the ability to be deformed under a certain condition such as a piezoelectric effect or an electrostrictive effect is disposed between the write word line WWL and the lower metal layer 17A.

Further, an upper metal layer 17B is formed on the MTJ element MTJ. The upper metal layer 17B is connected to a read bit line RBL. The write bit line WBL is formed on the MTJ element MTJ, and extends in the hard axis direction. A strained layer 18B having the ability to be deformed under a certain condition such as a piezoelectric effect or an electrostrictive effect is disposed between the write bit line WBL and the upper metal layer 17B.

The read bit line RBL and the write bit line WBL may be formed at a same level, or may be formed at different levels.

In the present embodiment, the strained layers 18A and 18B are made of insulating materials. When the strained layers 18 is a material having an electrostrictive effect, $Pb(Mg_{1/3}Nb_{2/3})O_3$—$PbTiO_3$ solid solution (PMN-PT), or the like is used as the strained layers 18A and 18B. Further, when the strained layers 18A and 18B are materials having a piezoelectric effect, $Pb(Zr, Ti)O_3$ solid solution (PZT), BaTi $O_3$ (BTO), Ba (Ti, Zr) $O_3$, Rochelle salt, PVDF (Polyvinylidenefloride) of piezoelectric polymer, or the like is used as the strained layers 18A and 18B.

In the case of the present embodiment, the memory layer is made of a material having magnetostriction.

The memory layer of the MTJ element MTJ is made to be in a state in which it is difficult to bring about magnetization inversion or in a state in which it is easy to bring about magnetization inversion due to a magnetostrictive (Villari) effect by receiving a stress from the strained layers 18A and 18B. The MTJ element MTJ may be a top pin type in which the memory layer is disposed at a position near to the strained layer 18A, or may be a bottom pin type in which the memory layer is disposed at a position near to the strained layer 18B.

B. Memory Cell Array

Figure 37:
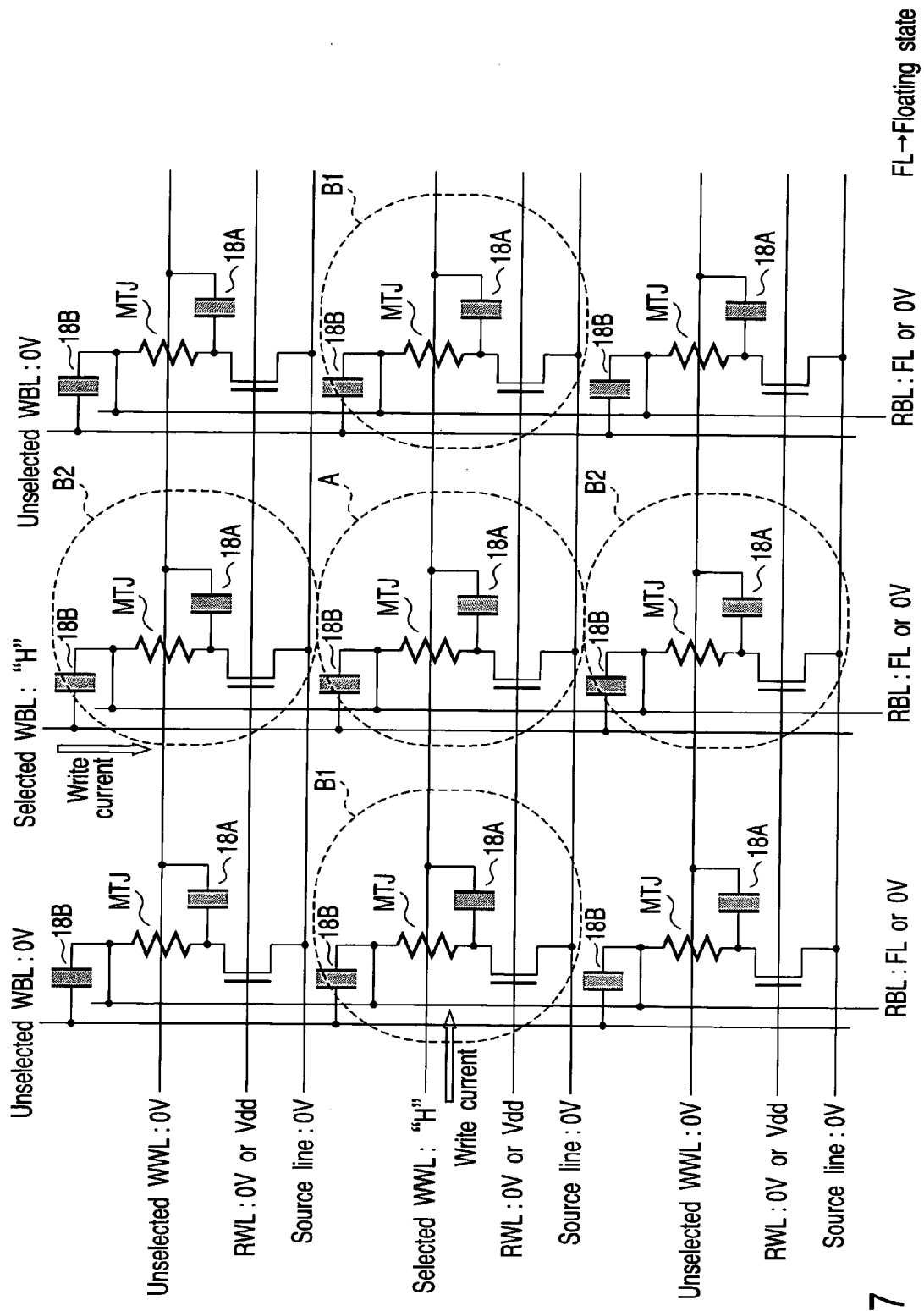
FIG. 37 is a circuit diagram showing a memory cell array according to the fifth embodiment.

FIG. 37 shows an equivalent circuit diagram of a memory cell array configured by using the memory cell of FIG. 36.

The feature of the memory cell array of the embodiment is that the strained layer (insulating material) 18A is disposed between one end of an MTJ element MTJ and a write word line WWL in the 1MOST-1MTJ type memory cell array, and the strained layer (insulating material) 18B is disposed between the other end of the MTJ element MTJ and the write bit line WBL.

A capacitor is formed from the lower metal layer at the one end of the MTJ element, the write word line WWL, and the strained layer 18A, and a capacitor is formed from the upper metal layer at the other end of the MTJ element MTJ,
the write bit line WBL, and the strained layer 18B. Due to a potential difference being generated between the capacitors, the strained layers 18A and 18B extend or shrink in a direction of applying a voltage, and an application or a relaxation of a stress with respect to the MTJ element MTJ is executed.

C. Principle of Writing: No. 1

Next, a principle of writing: No. 1 will be described with reference to the memory cell array of FIG. 37. The principle of writing: No. 1 is an example of a case where the upper/lower metal layers sandwiching the MTJ element MTJ are set to be in a floating state at the time of data writing.

Figure 38:
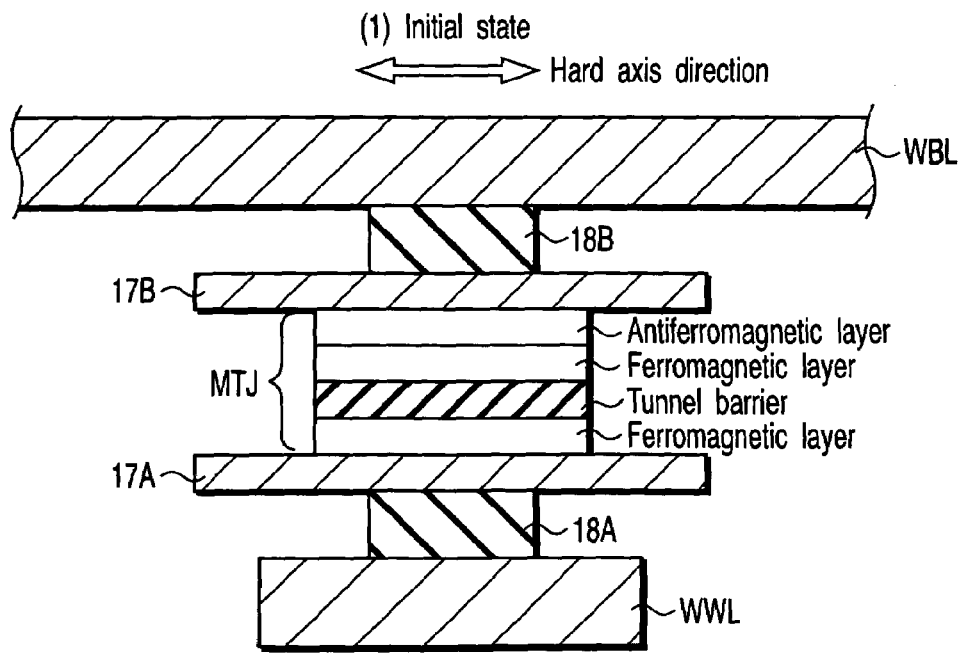
FIG. 38 is a sectional view showing a state of an MTJ element and strained layers at the time of the toggle writing.

In an initial state before the time of data writing, as shown in FIG. 38, both of the strained layers 18A and 18B are not deformed, and a tensile stress is not being applied to the MTJ element MTJ.

First, a write current is made to flow into a selected write word line (selected WWL), and other unselected write word lines (unselected WWLs) and all write bit lines (selected/unselected WBLs) are set to an earthing potential. Further, all read word lines (RWLs) and a source line are set to an earthing potential, and all read bit lines RBLs are set to be in a floating (FL) state.

Figure 39:
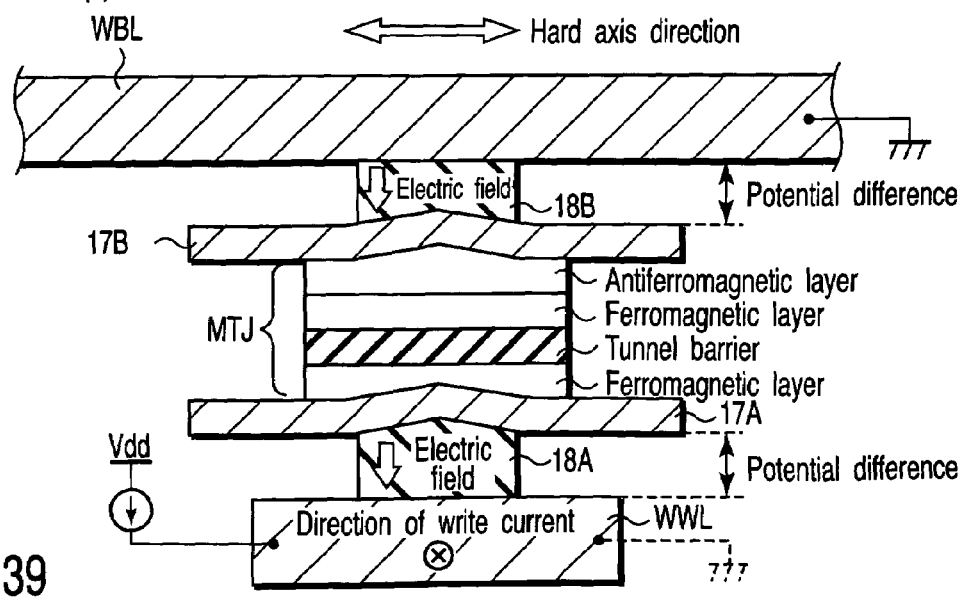
FIG. 39 is a sectional view showing a state of the MTJ element and the strained layers at the time of the toggle writing.

At that time, because the selected MTJ element MTJ existing in the region enclosed with the broken line A is disposed between the selected write word line (selected WWL) and the selected write bit line (selected WBL), as shown in FIG. 39, a potential difference is generated between the lower metal layer 17A and the write word line WWL, and a potential difference is generated between the upper metal layer 17B and the write bit line WBL.

Because electric fields are generated in the strained layers 18A and 18B due to the potential differences, and the strained layers 18A and 18B extend in a direction of applying a voltage due to the electric fields, a tensile stress is applied in the hard axis direction to the memory layer of the selected MTJ element MTJ.

Because the spontaneous magnetization on the memory layer of the selected MTJ element MTJ is reduced due to the tensile stress in the hard axis direction, and a switching magnetic field is made little, it is easy to carry out data writing with respect to the selected MTJ element MTJ.

Further, in order to establish such a state, it is designed such that the conductance of the write word line WWL and the data selecting line BL are made little enough to be ignored as compared with the conductance of the driver/sinker which generates a write current.

Next, while making a write current flow into the selected write word line (selected WWL), a write current is further made to flow into the selected write bit lines(selected WBL). In addition, the other unselected write word lines (unselected WWLs) and the unselected write bit lines (unselected WBLs) are set to an earthing potential.

Figure 40:
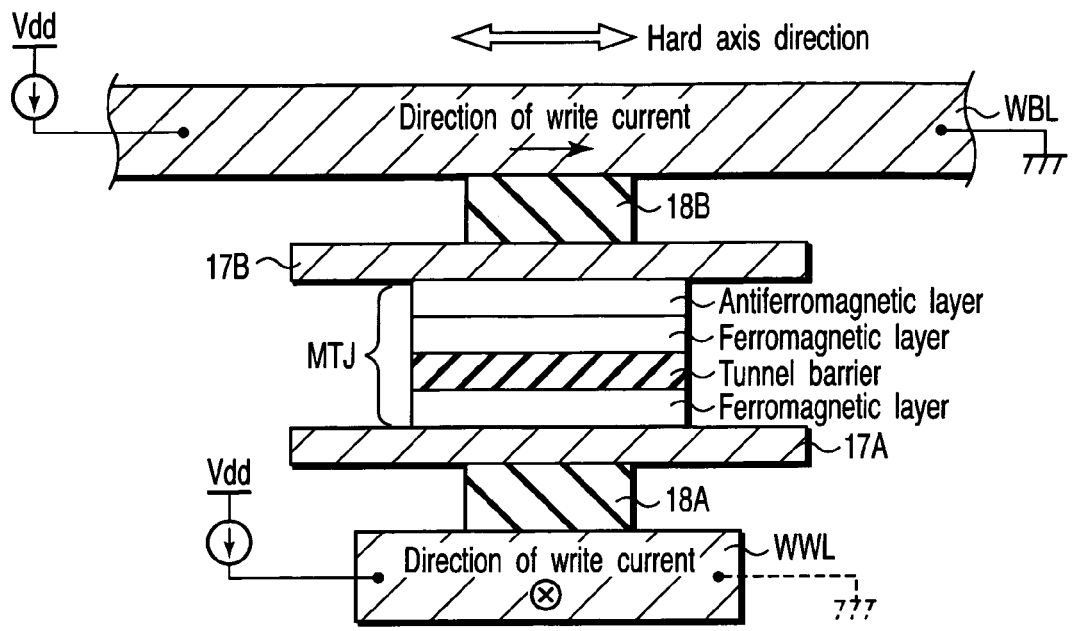
FIG. 40 is a sectional view showing a state of the MTJ element and the strained layers at the time of the toggle writing.

At that time, with respect to the selected MTJ element MTJ existing in the region enclosed with the broken line A, as shown in FIG. 40, the potential difference between the lower metal layer 17A and the write word line WWL is relieved, and the potential difference between the upper metal layer 17B and the write bit line WBL is relieved.

Accordingly, because the distortions of the strained layers 18A and 18B are relieved, and the strained layers 18A and 18B are restored to the original shapes from a state of being extended in a direction of applying a voltage, the tensile stress which had been applied in the hard axis direction to the memory layer of the selected MTJ element MTJ is relieved.

In accordance therewith, because the antiferromagnetic coupling between the fixed layer and the memory layer of the selected MTJ element MTJ is made stronger, and the magnetizing directions of both of those are made to turn to be opposite to one another, magnetization inverting operation is carried out more smoothly than that in a prior art.

Further, in order to establish such a state, it is designed such that the conductance of the write word line WWL and the data selecting line BL are made little enough to be ignored as compared with the conductance of the driver/sinker which generates a write current.

Next, the write current flowing into the selected write word line (selected WWL) is cut off, and a write current is made to flow into only the selected write bit line (selected WBL). Namely, all the write word lines (selected/unselected WWLs) and the unselected write word lines (unselected WWLs) other than the selected write bit line (selected WBL) are set to an earthing potential.

Figure 41:
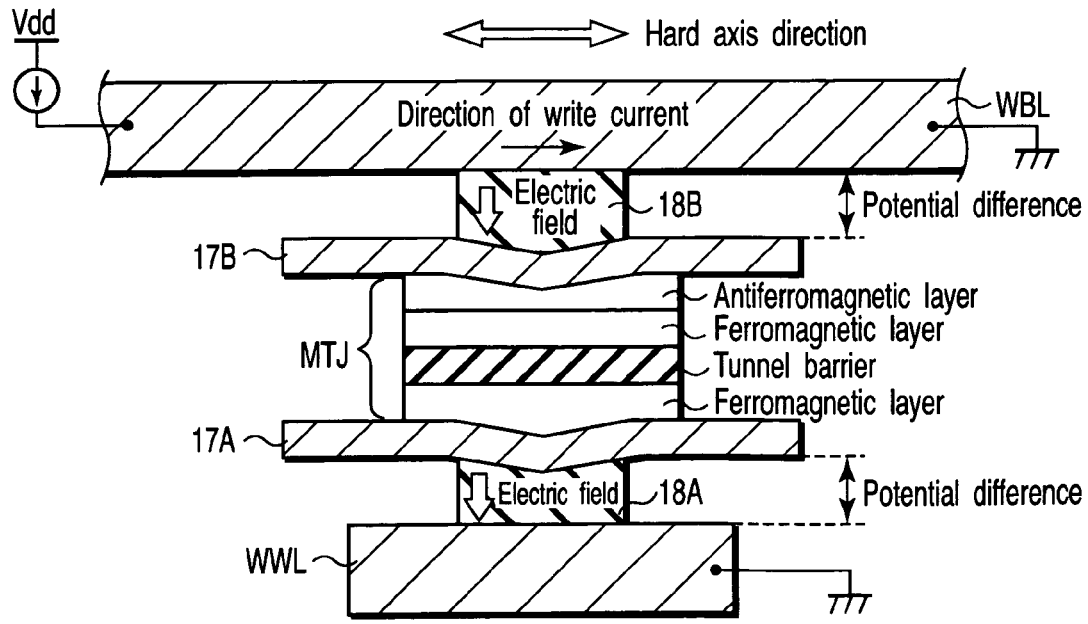
FIG. 41 is a sectional view showing a state of the MTJ element and the strained layers at the time of the toggle writing.

At that time, because the selected MTJ element MTJ existing in the region enclosed with the broken line A is disposed between the selected write word line (selected WWL) and the selected write bit line (selected WBL), as shown in FIG. 41, a potential difference is generated between the lower metal layer 17A and the write word line WWL, and a potential difference is generated between the upper metal layer 17B and the write bit line WBL.

Because electric fields are generated in the strained layers 18A and 18B due to the potential differences, and the strained layers 18A and 18B extend or shrink in a direction of applying a voltage due to the electric fields, a tensile stress is applied in the hard axis direction to the memory layer of the selected MTJ element MTJ.

Because the spontaneous magnetization on the memory layer of the selected MTJ element MTJ is reduced due to the tensile stress in the hard axis direction, and a switching magnetic field is made little, the magnetized state after the magnetization inversion is easy to settle down with respect to the selected MTJ element MTJ.

Further, in order to establish such a state, it is designed such that the conductance of the write word line WWL and the data selecting line BL are made little enough to be ignored as compared with the conductance of the driver/sinker which generates a write current.

Finally, the electric current flowing into the selected write bit line (selected WBL) is cut off, and the states of the strained layers 18A and 18B are made to return to the initial state shown in FIG. 38.

In this way, in accordance with the principle of writing: No. 1 of the fifth embodiment, a state is established in which, effect with respect to the selected MTJ element MTJ, it is easy to bring about magnetization inversion and the magnetized state after the magnetization inversion is easy to settle down by reducing the spontaneous magnetization on the memory layer due to a magnetostrictive effect at the time of data writing. Therefore, in the toggle writing method in which the writing selectivity is high, the switching magnetic field is further made little, and the write current can be reduced.

D. Principle of Writing: No. 2

Next, a principle of writing: No. 2 will be described with reference to the memory cell array of FIG. 37. The principle of writing: No. 2 is an example of a case where the upper/lower metal layers sandwiching the MTJ element MTJ are set to a fixed electric potential (for example, an earthing potential) at the time of data writing.

Figure 42:
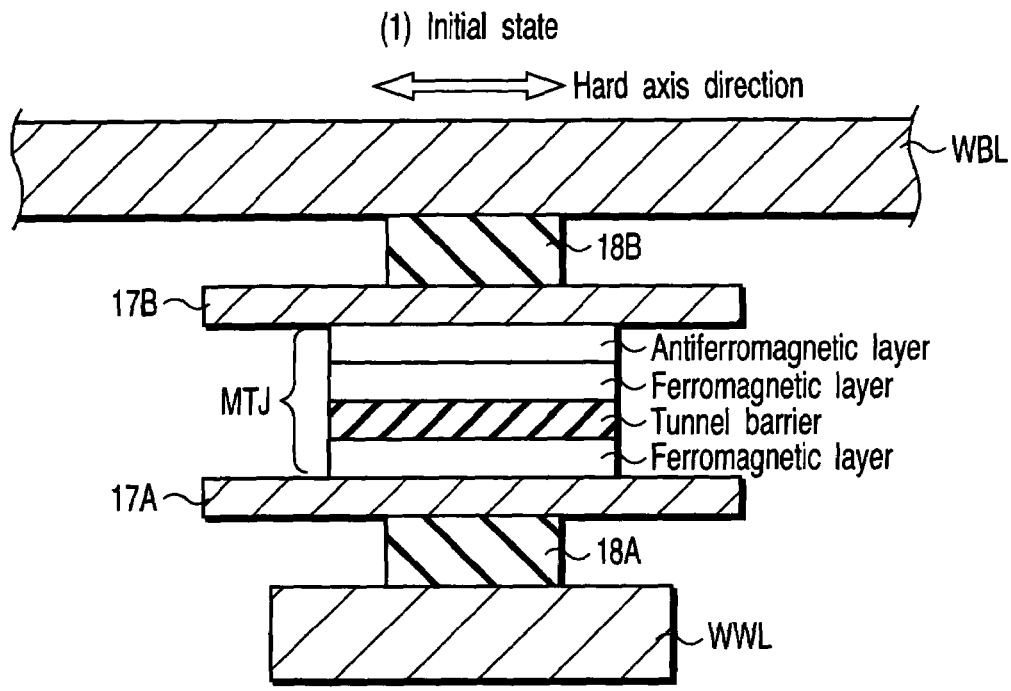
FIG. 42 is a sectional view showing a state of the MTJ element and the strained layers at the time of the toggle writing.

In an initial state before the time of data writing, as shown in FIG. 42, both of the strained layers 18A and 18B are not deformed, and a tensile stress is not being applied to the MTJ element MTJ.

First, a write current is made to flow into a selected write word line (selected WWL), and other unselected write word lines (unselected WWLs) and all the write bit lines (selected/unselected WBLs) are set to an earthing potential.

Further, all read word lines (RWLs) are set to a source potential Vdd, and all read selective switches are made to be in an ON-state. Further, a source line is set to an earthing potential, and all read bit lines RBLs are set to an earthing potential.

Figure 43:
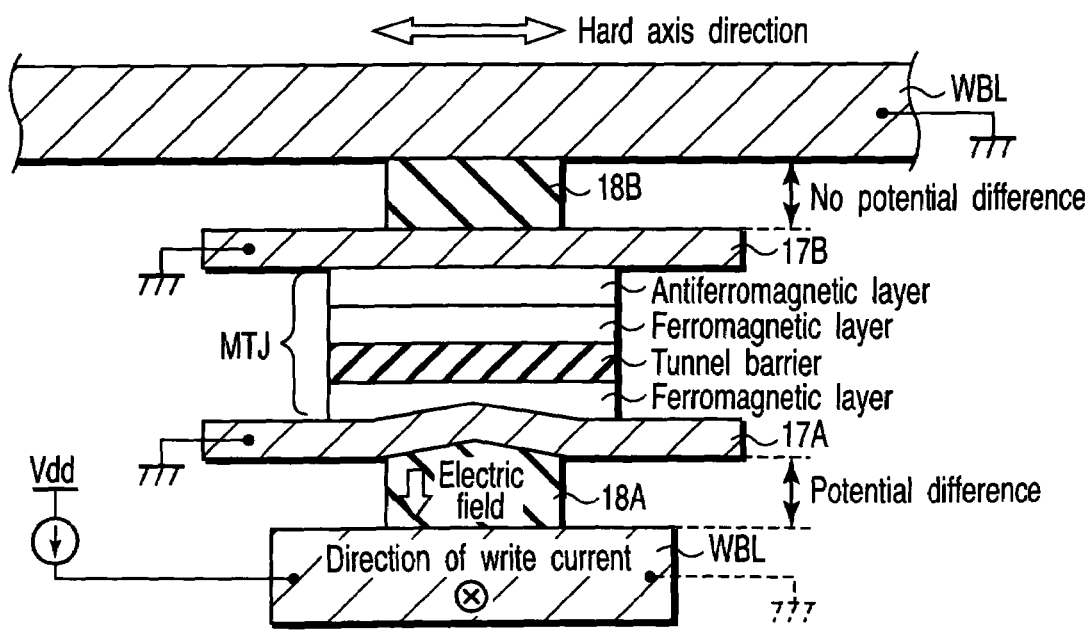
FIG. 43 is a sectional view showing a state of the MTJ element and the strained layers at the time of the toggle writing.

At that time, because the selected MTJ element MTJ existing in the region enclosed with the broken line A is disposed between the selected write word line (selected WWL) and the selected write bit line (selected WBL), as shown in FIG. 43, a potential difference is generated between the lower metal layer 17A and the write word line WWL.

Because an electric field is generated in the strained layer 18A due to this potential difference, and the strained layer 18A extends in a direction of applying a voltage due to the electric field, a tensile stress is applied in the hard axis direction to the memory layer of the selected MTJ element MTJ.

Because the spontaneous magnetization on the memory layer of the selected MTJ element MTJ is reduced due to the tensile stress in the hard axis direction, and a switching magnetic field is made little, it is easy to carry out data writing with respect to the selected MTJ element MTJ.

Further, in order to establish such a state, it is designed such that the conductance of the write word line WWL and the data selecting line BL are made little enough to be ignored as compared with the conductance of the driver/sinker which generates a write current.

Next, while making a write current flow into the selected write word line (selected WWL), a write current is further made to flow into the selected write bit line (selected WBL). In addition, the other unselected write word lines (unselected WWLs) and the unselected write bit lines (unselected WBLs) are set to an earthing potential.

Figure 44:
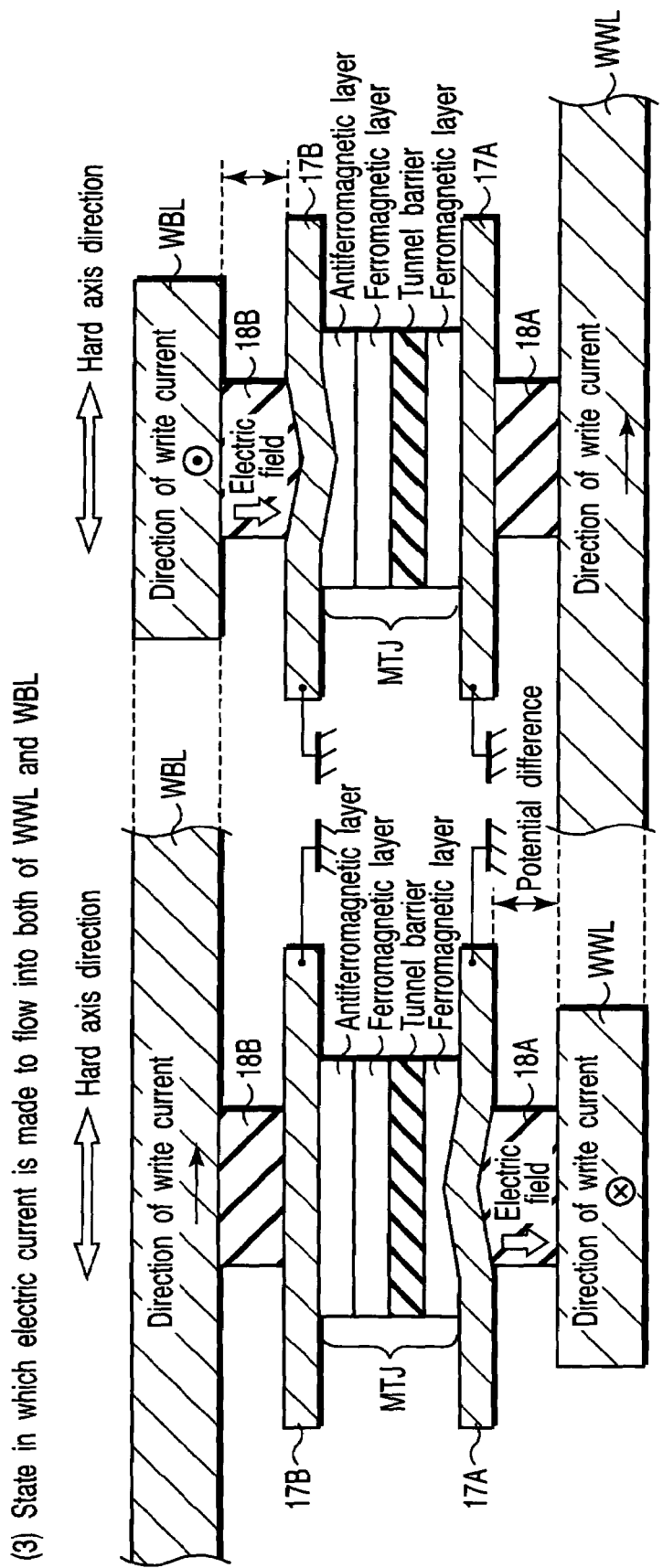
FIG. 44 is a sectional view showing a state of the MTJ element and the strained layers at the time of the toggle writing.

At that time, because the MTJ element MTJ existing in the region enclosed with the broken line A is disposed between the selected write word line (selected WWL) and the selected write bit line (selected WBL), as shown in FIG. 44, a potential difference is generated between the lower metal layer 17A and the write word line WWL, and a potential difference is generated between the upper metal layer 17B and the write bit line WBL.

Because an electric field is generated in the strained layer 18A due to this potential difference between the upper metal layer 17B and the write bit line WBL, and the strained layer 18A extends in a direction of applying a voltage due to the electric field, a tensile stress is applied in the hard axis direction to the memory layer of the selected MTJ element MTJ.

Because the spontaneous magnetization on the memory layer of the selected MTJ element MTJ is reduced due to the tensile stress in the hard axis direction, and a switching magnetic field is made little, it is easy to carry out data writing with respect to the selected MTJ element MTJ.

Further, because an electric field is generated in the strained layer 18B due to this potential difference between the upper metal layer 17B and the write bit line WBL, and the strained layer 18B extends in a direction of applying a voltage due to the electric field, a tensile stress is applied in the hard axis direction to the memory layer of the selected MTJ element MTJ.

Because the spontaneous magnetization on the memory layer of the selected MTJ element MTJ is reduced due to the tensile stress in the hard axis direction, and an switching magnetic field is made little, a state in which the magnetized state after the magnetization inversion is easy to settle down with respect to the selected MTJ element MTJ.

Further, in order to establish such a state, it is designed such that the conductance of the write word line WWL and the data selecting line BL are made little enough to be ignored as compared with the conductance of the driver/sinker which generates a write current.

Next, while making a write current flow into the selected write bit line (selected WBL), the electric current flowing into the selected write word line (selected WWL) is cut off. Namely, all the write word lines (selected/unselected WWLs) and the unselected data selecting lines (unselected BLs) other than the selected write bit line (selected WBL) are set to an earthing potential.

Figure 45:
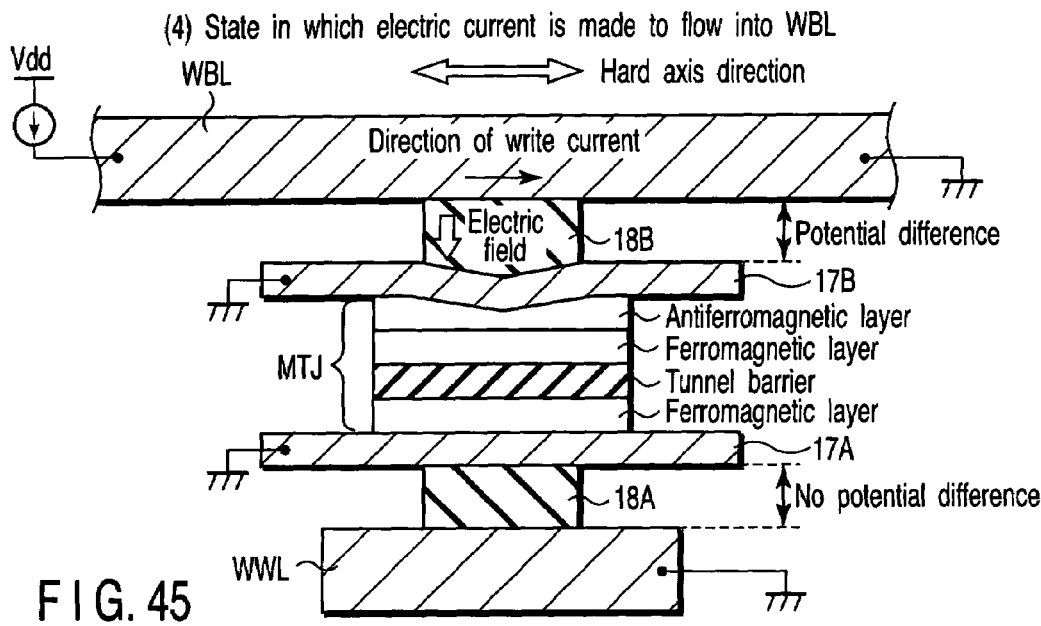
FIG. 45 is a sectional view showing a state of the MTJ element and the strained layers at the time of the toggle writing.

At that time, because the MTJ element MTJ existing in the region enclosed with the broken line A is disposed between the selected write word line (selected WWL) and the selected write bit line (selected WBL), as shown in FIG. 45, a potential difference is generated between the upper metal layer 17B and the write bit line WBL.

Because an electric field is generated in the strained layer 18B due to this potential difference, and the strained layer 18B extends in a direction of applying a voltage due to the electric field, a tensile stress is applied in the hard axis direction to the memory layer of the selected MTJ element MTJ.

Because the spontaneous magnetization on the memory layer of the selected MTJ element MTJ is reduced due to the tensile stress in the hard axis direction, and a switching magnetic field is made little, the magnetized state after the magnetization inversion becomes stable with respect to the selected MTJ element MTJ.

Further, in order to establish such a state, it is designed such that the conductance of the write word line WWL and the data selecting line BL are made little enough to be ignored as compared with the conductance of the driver/sinker which generates a write current.

Finally, the electric current flowing into the selected write bit line (selected WBL) is cut off, and the states of the strained layers 18A and 18B are made to return to being in the initial state shown in FIG. 42.

In this way, in accordance with the principle of writing: No. 2 of the fifth embodiment, a state is established in which it is easy to bring about magnetization inversion and the magnetized state after the magnetization inversion is easy to settle down by reducing the spontaneous magnetization on the memory layer due to a magnetostrictive effect with respect to the selected MTJ element MTJ at the time of data writing. Therefore, in the toggle writing method in which the writing selectivity is high, the switching magnetic field is further made little, and the write current can be reduced.

E. Principle of Writing: No. 3

With respect to the principles of writing No. 1 and No. 2, in the same way as in the third embodiment described above, a stress is not applied to the MTJ element in the initial state, and a proposal of the principle has been made in which it is easy to invert magnetization and the magnetized state after the magnetization inversion becomes stable, for example, by applying a tensile stress to the MTJ element, at the time of data writing.

Here, in the same way as in the fourth embodiment described above, with the state in which a tensile stress is being applied to the MTJ element being as an initial state, the example of the present invention can be applied with respect to the principles of writing No. 1 and No. 2 as well. Namely, a tensile stress is applied to the MTJ element in advance as the initial state, and the principles can be made to be a principle in which it is easy to invert magnetization, and the magnetized state after the magnetization inversion becomes stable, for example, by relaxing the tensile stress at the time of data writing.

(6) Sixth Embodiment

A sixth embodiment of the invention relates to a magnetic random access memory having a laminated MTJ structure in which MTJ elements are laminated on a semiconductor substrate.

A. Memory Cell

Figure 46:
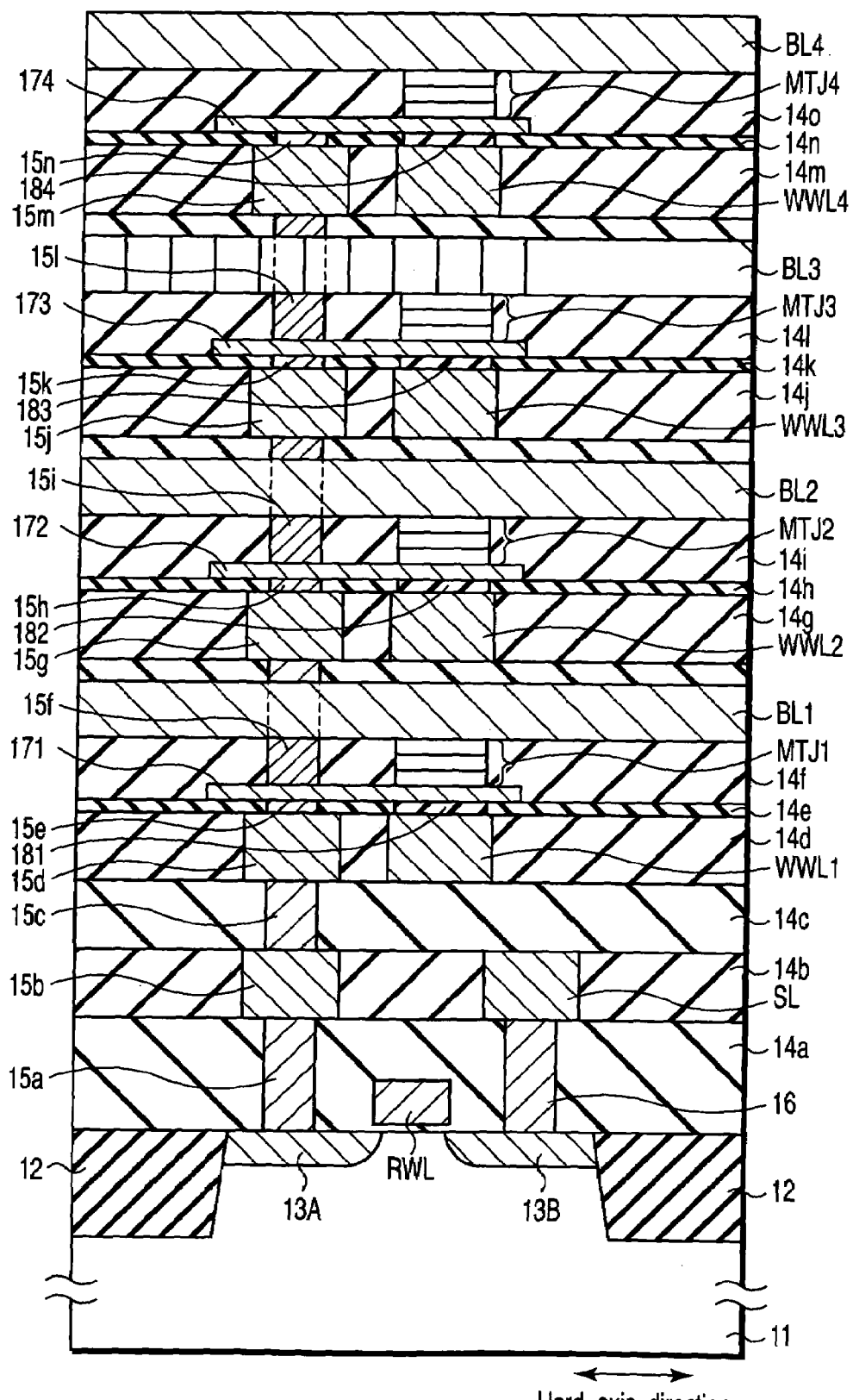
FIG. 46 is a sectional view showing a memory cell according to a sixth embodiment of the invention.

FIG. 46 shows a structure of a memory cell of a magnetic random access memory according to the sixth embodiment.

In the present embodiment, a 1MOST+nMTJ type memory cell formed from one transistor and n (n is a plural) MTJ elements is an object.

The element isolation regions 12 having the STI structure are formed on the surface region of the semiconductor substrate 11. A MOS transistor serving as a read selective switch is formed within an element region surrounded by the element isolation regions 12. The gate of the MOS transistor becomes a read word line RWL.

The drain 13A of the MOS transistor is connected to lower metal layers 17₁, 17₂, 17₃, and 17₄ via the contact plugs 15a, 15c, 15e, 15f, 15h, 15i, 15k, 15l, and 15n, and intermediate layers 15b, 15d, 15g, 15j, and 15m. Further, the source 13B of the MOS transistor is connected to the source line SL via the contact plug 16.

MTJ elements MTJ1, MTJ2, MTJ3, and MTJ4 are formed on the lower metal layers 17₁, 17₂, 17₃, and 17₄. The MTJ elements MTJ1, MTJ2, MTJ3, and MTJ4 are laminated on the semiconductor substrate 11.

The MTJ elements MTJ1, MTJ2, MTJ3, and MTJ4 respectively have two ferromagnetic layers 19a and 19b, and the tunnel barrier 20 disposed therebetween. One of the two ferromagnetic layers 19a and 19b becomes a memory layer (free layer), and the other one becomes a fixed layer (pinned layer).

A write word line WWL1 is formed at a level which is the same as that of the intermediate layer 15d, and extends in the easy axis direction of the MTJ element MTJ1. A strained layer 18₁ having the ability to be deformed under a certain condition such as a piezoelectric effect or an electrostrictive effect is disposed between the write word line WWL1 and the lower metal layer 17₁.

In the same way, the write word line WWL2 is formed at a level which is the same as that of the intermediate layer 15g, and extends in the easy axis direction of the MTJ element MTJ2. A strained layer 18₂ having the ability to be deformed under a certain condition such as a piezoelectric effect or an electrostrictive effect is disposed between the write word line WWL2 and the lower metal layer 17₂.

Further, the write word line WWL3 is formed at a level which is the same as that of the intermediate layer 15j, and extends in the easy axis direction of the MTJ element MTJ3. A strained layer 18₃ having the ability to be deformed under a certain condition such as a piezoelectric effect or an electrostrictive effect is disposed between the write word line WWL3 and the lower metal layer 173.

Further, the write word line WWL4 is formed at a level which is the same as that of the intermediate layer 15*m*, and extends in the easy axis direction of the MTJ element MTJ4. A strained layer 184 having the ability to be deformed under a certain condition such as a piezoelectric effect or an electrostrictive effect is disposed between the write word line WWL4 and the lower metal layer 174.

The strained layers 181, 182, 183, and 184 are made of insulating materials. When the strained layers 181, 182, 183, and 184 are materials having an electrostrictive effect, $Pb(Mg_{1/3}Nb_{2/3})O_3$—$PbTiO_3$ solid solution (PMN-PT), or the like are used as the strained layers 181, 182, 183, and 184. Further, when the strained layers 181, 182, 183, and 184 are materials having a piezoelectric effect, $Pb(Zr, Ti)O_3$ solid solution (PZT), $BaTi\ O_3$ (BTO), $Ba\ (Ti, Zr)\ O_3$, Rochelle salt, PVDF (Polyvinylidenefloride) of piezoelectric polymer, or the like are used as the strained layers 181, 182, 183, and 184.

In the case of the present embodiment, the memory layer is made of a material having magnetostriction. The memory layers of the MTJ elements MTJ1, MTJ2, MTJ3, and MTJ4 are made to be in a state in which it is difficult to bring about magnetization inversion or in a state in which it is easy to bring about magnetization inversion due to a magnetostrictive (Villari) effect by receiving a stress from the strained layers 181, 182, 183, and 184. Therefore, the MTJ elements MTJ1, MTJ2, MTJ3, and MTJ4 are preferably top pin types in which the memory layers are disposed at positions near to the strained layers 181, 182, 183, and 184.

Data selecting lines (write bit lines) BL1, BL2, BL3, and BL4 are formed on the MTJ elements MTJ1, MTJ2, MTJ3, and MTJ4. The data selecting lines BL1, BL2, BL3, and BL4 are connected to the MTJ elements MTJ1, MTJ2, MTJ3, and MTJ4, and extend in the hard axis directions of the MTJ elements MTJ1, MTJ2, MTJ3, and MTJ4.

B. Memory Cell Array

Figure 47:
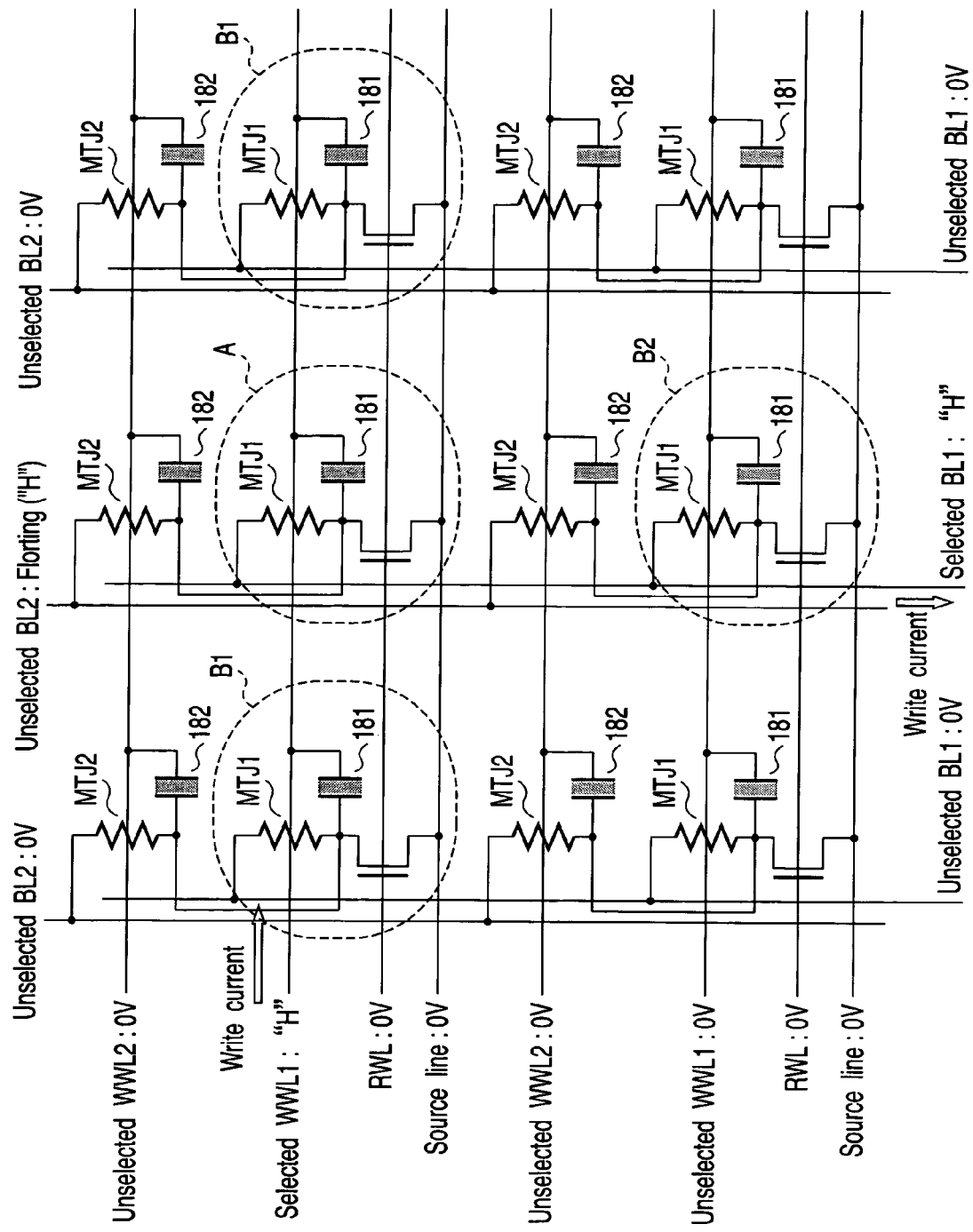
FIG. 47 is a circuit diagram showing a memory cell array according to the sixth embodiment.

FIG. 47 shows an equivalent circuit diagram of a memory cell array configured by using the memory cell of FIG. 46.

However, here, in order to understandably show the circuit configuration of the memory cell array, the number of the MTJ elements to be laminated on the semiconductor substrate is made to be, not "4", but "2", and the memory cell array is made to be a 1MOST-2MTJ type memory cell array.

The feature of the memory cell array of the present embodiment is that the strained layers (insulating materials) 181 and 182 are disposed between one end of the MTJ elements MTJ1 and MTJ2 and the write word lines WWL1 and WWL2.

Capacitors are formed from the lower metal layers at the one ends of the MTJ elements MTJ1 and MTJ2, the write word lines WWL1 and WWL2, and the strained layers 181 and 182. Due to a potential difference being generated between the capacitors, the strained layers 181 and 182 extend or shrink in a direction of applying a voltage, and applications or relaxations of stress with respect to the MTJ elements MTJ1 and MTJ2 are executed.

C. Principle of Writing

Next, a principle of writing according to the sixth embodiment will be simply described with reference to the memory cell array of FIG. 47.

Here, suppose that the magnetostriction constant and the electrostriction constant are respectively positive values. Further, suppose that the strained layers (insulating materials) extend in a direction of applying a voltage due to a piezoelectric effect or an electrostrictive effect. Further, suppose that the strained layers have a shape so as to apply a tensile stress in the easy axis direction with respect to the memory layer of the MTJ element, for example, a quadrangle, and it is the shape in which the sides in the hard axis direction are the same as or longer than the short sides of the MTJ element (the sides in the hard axis direction), and the sides in the easy axis direction are shorter than the long sides of the MTJ element (the sides in the easy axis direction).

First, a write current is respectively made to flow into a selected write word line (selected WWL1) and a selected data selecting line (selected BL1), and other unselected write word lines (unselected WWL1, unselected WWL2) and unselected data selecting lines (unselected BL1, unselected BL2) are set to an earthing potential.

Because the data selecting lines BL1 and BL2 are in ohmic contact with the MTJ elements MTJ1 and MTJ2, the capacitors formed from the lower metal layers at the one ends of the MTJ elements MTJ1 and MTJ2, the write word lines WWL1 and WWL2, and the strained layers 181 and 182 disposed therebetween are charged.

At that time, because the selected MTJ element MTJ existing in the region enclosed with the broken line A is disposed between the selected write word line (selected WWL1) and the selected data selecting line (selected BL1), a potential difference is hardly generated between the lower metal layer and the write word line WWL1, and there is no deformation in the strained layer 181 disposed therebetween.

Further, in order to establish such a state, it is designed such that the conductance of the write word lines WWL1 and WWL2 and the data selecting lines BL1 and BL2 are made little enough to be ignored as compared with the conductance of the driver/sinker which generates a write current.

In contrast thereto, the half-selected MTJ element MTJ1 existing in the region enclosed with the broken line B1 is disposed between the selected write word line (selected WWL1) and the unselected data selecting line (unselected BL1), and the half-selected MTJ element MTJ1 existing in the region enclosed with the broken line B2 is disposed between the unselected write word line (unselected WWL1) and the selected data selecting line (selected BL1).

Therefore, a potential difference is generated between the lower metal layer and the write word line WWL1. Because the strained layer 181 extends in a direction of applying a voltage due to this potential difference, a tensile stress is applied in the easy axis direction to the half-selected MTJ element MTJ1.

Because a Villari effect that the spontaneous magnetization on the memory layer of the half-selected MTJ element MTJ1 is increased is generated due to the tensile stress in the easy axis direction, and a switching magnetic field is increased, the error writing tolerance is improved.

Meanwhile, because the unselected MTJ elements MTJ1 and MTJ2 which have not been enclosed with any of the broken lines A, B1, and B2 are disposed between the unselected write word lines (unselected WWL1, unselected WWL2) and the unselected data selecting lines (unselected BL1, unselected BL2) which have been set to an earthing potential, in the same way as the selected MTJ element MTJ1, there is no case where a potential difference is generated between the lower metal layer and the write word lines WWL1 and WWL2, and there is no deformation in the strained layers 181 and 182 disposed therebetween.

In this way, in accordance with the sixth embodiment, a state is established in which it is difficult to bring about magnetization inversion with respect to only the half-selected MTJ elements MTJ1 and MTJ2 by increasing the spontaneous magnetization on the memory layer due to a magnetostrictive effect at the time of data writing. Therefore, the coercive forces of the memory layers of the MTJ elements MTJ1 and MTJ2 in a state in which a stress is not being applied are made little, and the write current can be reduced. In addition, even if the coercive forces of the memory layers are made little, there is no case where error writing is brought about. Note that, provided that materials having a large magnetostriction constant are used as the memory layers of the MTJ elements MTJ1 and MTJ2, the error writing tolerance of the half-selected cell is further improved.

(7) Seventh Embodiment

A seventh embodiment of the invention relates to a magnetic random access memory which executes data writing with respect to an MTJ element by using a magnetic field generated by an electric current flowing in three write lines.

A. Memory Cell

Figure 48:
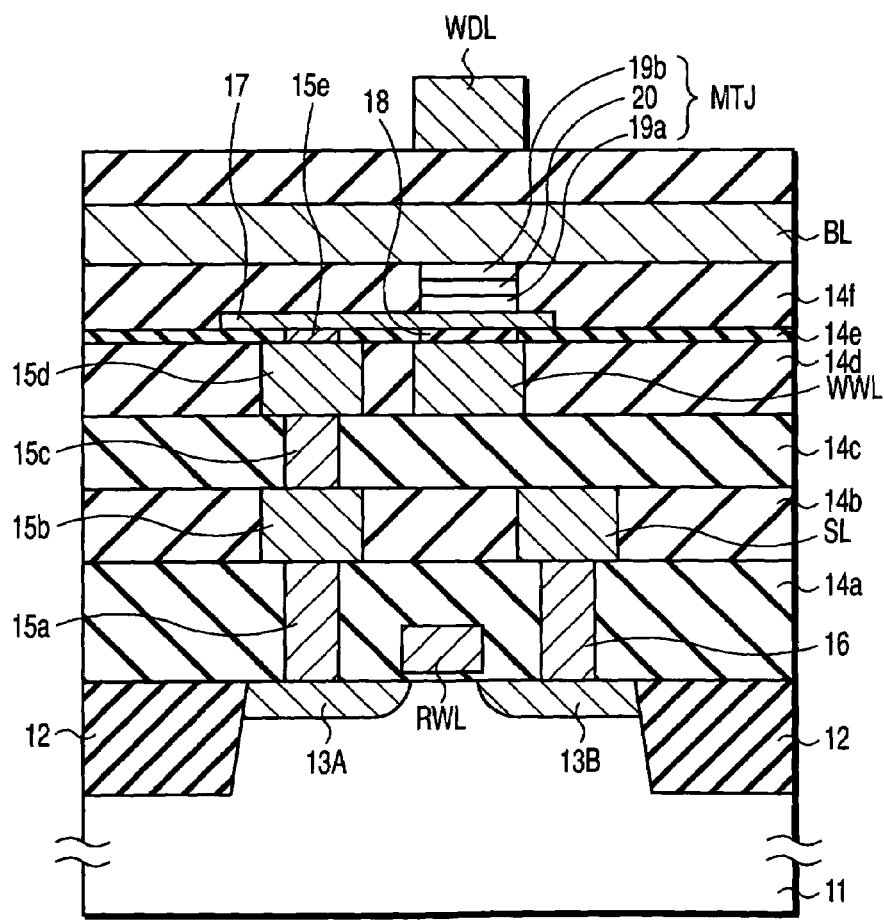
FIG. 48 is a sectional view showing a memory cell according to a seventh embodiment of the invention.

FIG. 48 shows a structure of a memory cell of a magnetic random access memory according to the seventh embodiment.

In the present embodiment, a 1MOST+1MTJ type memory cell formed from one transistor and one MTJ element is an object.

The element isolation regions 12 having the STI structure are formed on the surface region of the semiconductor substrate 11. A MOS transistor serving as a read selective switch is formed within an element region surrounded by the element isolation regions 12. The gate of the MOS transistor will be served as a read word line RWL.

The drain 13A of the MOS transistor is connected to the lower metal layer 17 via the contact plugs 15a, 15c, and 15e, and the intermediate layers 15b and 15d. Further, the source 13B of the MOS transistor is connected to a source line SL via the contact plug 16.

An MTJ element MTJ is formed on the lower metal layer 17. The MTJ element MTJ has the two ferromagnetic layers 19a and 19b, and the tunnel barrier 20 disposed therebetween. One of the two ferromagnetic layers 19a and 19b will be served as a memory layer (free layer), and the other will be served as a fixed layer (pinned layer).

The write word line WWL is formed at a level which is the same as that of the intermediate layer 15d, and extends in the easy axis direction of the MTJ element MTJ. The strained layer 18 having the ability to be deformed under a certain condition such as a piezoelectric effect or an electrostrictive effect is disposed between the write word line WWL and the lower metal layer 17.

The strained layer 18 is made of an insulating material. When the strained layer 18 is a material having an electrostrictive effect, $Pb(Mg_{1/3}Nb_{2/3})O_3$—$PbTiO_3$ solid solution (PMN-PT), or the like is used as the strained layer 18. Further, When the strained layer 18 is a material having a piezoelectric effect, $Pb(Zr, Ti)O_3$ solid solution (PZT), $BaTiO_3$ (BTO), Ba (Ti, Zr) $O_3$, Rochelle salt, PVDF (Polyvinylidenefloride) of piezoelectric polymer, or the like is used as the strained layer 18.

In the case of the present embodiment, the memory layer is made of a material having magnetostriction. Because the memory layer of the MTJ element MTJ is made to be in a state in which it is difficult to bring about magnetization inversion or in a state in which it is easy to bring about magnetization inversion due to magnetostriction by receiving a stress from the strained layer 18, the MTJ element MTJ is preferably a top pin type in which the memory layer is disposed at a position near to the strained layer 18.

A data selecting line (write bit line) BL is formed on the MTJ element MTJ. The data selecting line BL is connected to the MTJ element MTJ, and extends to the hard axis direction of the MTJ element MTJ.

Moreover, a write digit line WDL is formed at the upper portion of the data selecting line BL via the insulating layer. Among the three write lines, the write digit line WDL is most separated away from the MTJ element MTJ, and acts as an auxiliary of the two write lines WWL and BL intersecting each other at the time of data writing.

The write digit line WDL is formed, for example, so as to extend obliquely at 45° with respect to the two write lines WWL and BL.

B. Memory Cell Array

Figure 49:
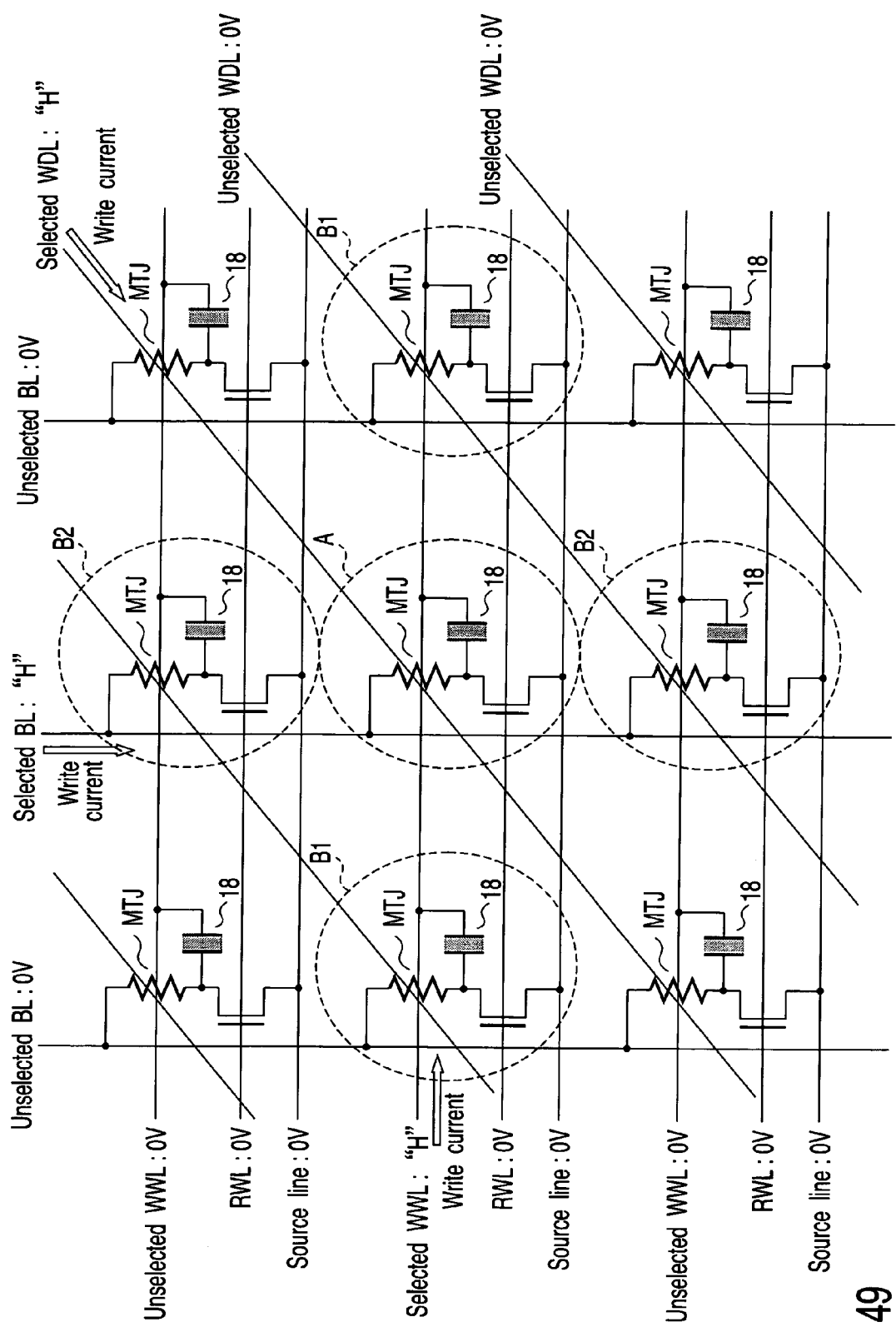
FIG. 49 is a circuit diagram showing a memory cell array according to the seventh embodiment.

FIG. 49 shows an equivalent circuit diagram of a memory cell array configured by using the memory cell of FIG. 48.

The feature of the memory cell array of the present embodiment is that the strained layer (insulating material) 18 is disposed between one end of the MTJ element MTJ and the write word line WWL.

A capacitor is formed from the lower metal layer at the one end of the MTJ element MTJ, the write word line WWL, and the strained layer 18. Due to a potential difference being generated between the capacitors, the strained layer 18 extends or shrinks in a direction of applying a voltage, and an application or a relaxation of a stress with respect to an MTJ element MTJ is executed.

Note that, among the three write lines, the write digit line WDL is most separated away from the MTJ element MTJ, which does not contribute to a piezo-electric effect or an electrostrictive effect on the strained layer 18.

C. Principle of Writing

A principle of writing using the memory cell array according to the seventh embodiment, in particular, an application or relaxation of a stress with respect to the MTJ element MTJ for controlling the extension or shrinkage of the strained layer 18 due to a piezoelectric effect or an electrostrictive effect, and writing ease/difficulty due to a magnetostrictive effect or a Villari effect is the same as that in the first embodiment described above. Therefore, detailed descriptions thereof will be omitted here.

In the seventh embodiment as well, the write current can be reduced by reducing the coercive force of the memory layer of the MTJ element MTJ in a state in which magnetostriction is not generated or in a state in which magnetostriction is generated. In addition, even if the coercive force of the memory layer is reduced in this way, there is no case where error writing is brought about by carrying out an application or relaxation of a stress with respect to the MTJ element MTJ at the time of data writing.

(8) Eighth Embodiment

An eighth embodiment of the invention is a modified example of the first to seventh embodiments described above, and relates to an electrostriction constant and a magnetostriction constant of a strained material.

Namely, the electrostriction constant and the magnetostriction constant are set as positive values in the magnetic random access memory of the first to seventh embodiments described above. However, here, a case where an electrostriction constant and a magnetostriction constant are set as negative values, and moreover, a combination of the values of the electrostriction constant and the magnetostriction constant will be described.

A. Electrostriction Constant

Because the electrostriction constant is made positive in first to seventh embodiments described above, if an electric field is applied to a strained material, the strained material extends in a direction of applying a voltage from being in a normal state or a shrunk state. In contrast thereto, in the eighth embodiment, the strained material is made of a material in which such that an electrostriction constant is made to be a negative value. In this case, if an electric field is applied to the strained material, the strained material shrinks from being in an extended state or a normal state.

Then, first, when the strained material is restored from being in an extended state to being in a normal state, the MTJ element is switched from being in the state in which a tensile stress is being applied thereto to being in the state in which the tensile stress is relaxed therefrom. Therefore, the writing ease/difficulty with respect to the MTJ element is controlled in accordance with the principle which is the same as those of the first to seventh embodiments described above, and a reduction in a write current and prevention of error writing are simultaneously realized.

Further, when the strained material is switched from being in a normal state to being in a shrunk state, the MTJ element is switched from being in the state in which a tensile stress is not being applied thereto to being in the state in which a tensile stress is applied thereto. Therefore, the writing ease/difficulty with respect to the MTJ element is controlled in accordance with the principle which is the same as those of the first to seventh embodiments described above, and a reduction in a write current and prevention of error writing are simultaneously realized.

B. Magnetostriction Constant

Because the magnetostriction constant is made positive in the first to seventh embodiments described above, if a tensile stress in the easy axis direction is applied to the memory layer of the MTJ element, a switching magnetic field is made great, and it is difficult to carry out writing. If a tensile stress in the hard axis direction is applied to the memory layer of the MTJ element, a switching magnetic field is made little, and it is easy to carry out writing.

In contrast thereto, when the memory layer of the MTJ element is made of a material in which such that a magnetostriction constant is made to be a negative value, if a tensile stress in the hard axis direction is applied to the memory layer of the MTJ element, a switching magnetic field is made great, and it is difficult to carry out writing. If a tensile stress in the easy axis direction is applied to the memory layer of the MTJ element, a switching magnetic field is made little, and it is easy to carry out writing.

Then, in order to establish a state in which it is difficult to carry out data writing with respect to the half-selected MTJ element at the time of data writing, a tensile stress in the hard axis direction may be applied to the half-selected MTJ element by using a strained material, or a tensile stress which has been applied in the easy axis direction in advance may be relaxed.

Further, in a case of using the toggle writing method, or the like, in order to establish a state in which it is easy to carry out data writing with respect to the selected MTJ element at the time of data writing, a tensile stress in the easy axis direction may be applied to the selected MTJ element by using a strained material, or a tensile stress which has been applied in the hard axis direction in advance may be relaxed.

C. Combinations

In case where a magnetostriction constant is positive, and an electrostriction constant is positive The case where a magnetostriction constant and an electrostriction constant are positive values is described in the first to seventh embodiments described above.

In Case Where a Magnetostriction Constant is Positive, and an Electrostriction Constant is Negative In the case where a magnetostriction constant is a positive value and an electrostriction constant is a negative value, in order to establish a state in which it is difficult to carry out data writing with respect to a half-selected MTJ element, the strained layer is switched from being in a normal state to being in a shrunk state, and a tensile stress in the easy axis direction may be applied to the MTJ element, or alternatively, the strained layer is restored from being in an extended state to being in a normal state, and the tensile stress which has been applied in the hard axis direction in advance to the MTJ element may be relaxed.

Further, in a case of using the toggle writing method, or the like, in order to establish a state in which it is easy to carry out data writing with respect to the selected MTJ element at the time of data writing, the strained layer is switched from being in a normal state to being in a shrunk state, and a tensile stress in the hard axis direction may be applied to the MTJ element, or alternatively, the strained layer is restored from being in an extended state to being in a normal state, and the tensile stress which has been applied in the easy axis direction in advance may be relaxed.

In Case Where a Magnetostriction Constant is Negative, and an Electrostriction Constant is Positive In the case where a magnetostriction constant is a negative value and an electrostriction constant is a positive value, first, in order to establish a state in which it is difficult to carry out data writing with respect to a half-selected MTJ element, the strained layer is switched from being in a normal state to being in an extended state, and a tensile stress in the hard axis direction may be applied to the MTJ element, or alternatively, the strained layer is restored from being in a shrunk state to being in a normal state, and the tensile stress which has been applied in the easy axis direction in advance to the MTJ element may be relaxed.

Further, in a case of using the toggle writing method, or the like, in order to establish a state in which it is easy to carry out data writing with respect to the selected MTJ element at the time of data writing, the strained layer is switched from being in a normal state to being in an extended state, and a tensile stress in the easy axis direction may be applied to the MTJ element, or alternatively, the strained layer is restored from being in a shrunk state to being in a normal state, and the tensile stress which has been applied in the hard axis direction in advance to the MTJ element may be relaxed.

In Case Where a Magnetostriction Constant is Negative, and an Electrostriction Constant is Negative In the case where both of a magnetostriction constant and an electrostriction constant are negative values, first, in order to establish a state in which it is difficult to carry out data writing with respect to a half-selected MTJ element, the strained layer is switched from being in a normal state to being in a shrunk state, and a tensile stress in the hard axis direction may be applied to the MTJ element, or alternatively, the strained layer is restored from being in an extended state to being in a normal state, and the tensile stress which has been applied in the easy axis direction in advance to the MTJ element may be relaxed.

Further, in a case of using the toggle writing method, or the like, in order to establish a state in which it is easy to carry out data writing with respect to the selected MTJ element at the time of data writing, the strained layer is switched from being in a normal state to being in a shrunk state, and a tensile stress in the easy axis direction may be applied to the MTJ element, or alternatively, the strained layer is restored from being in an extended state to being in a normal state, and the tensile stress which has been applied in the hard axis direction in advance to the MTJ element may be relaxed.

In any of the above-described combinations, with respect to the characteristic of switching (magnetization inversion), an asteroid curve having a shape on which regions to which a magnetic field in one of the easy axis direction and the hard axis direction is applied are more pointed, and regions to which magnetic fields in the both directions are applied are more depressed than that of the Stoner-Wohlfarth model, can be obtained.

(9) Other Embodiments

Figure 50:
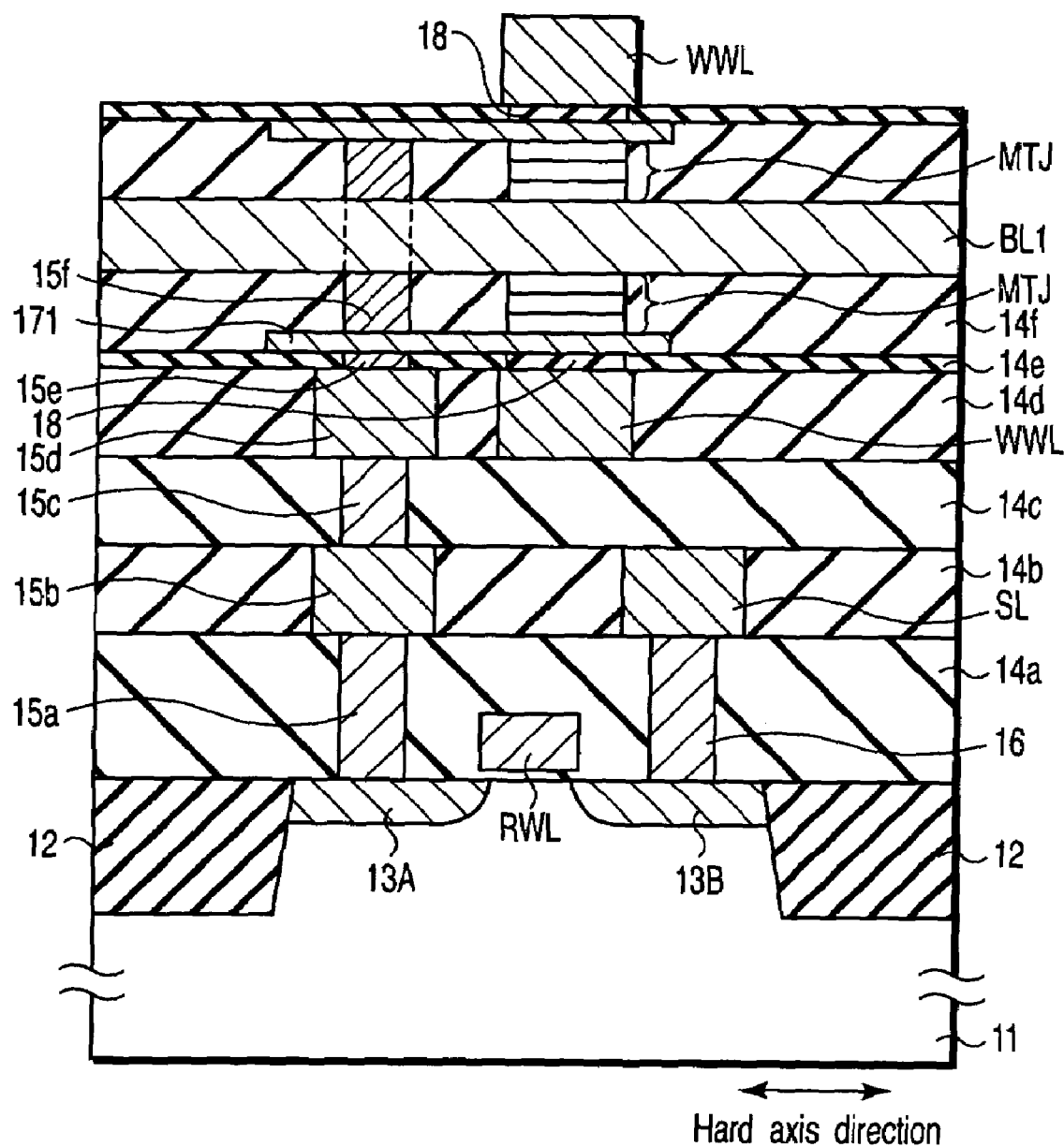
FIG. 50 is a sectional view showing a memory cell according to another embodiment of the invention.

An embodiment of FIG. 50 relates to a magnetic random access memory in which MTJ elements MTJs are disposed at the upper portion and the lower portion of a data selecting line (write bit line) BL. The MTJ element MTJ at the lower portion is, as described in the above-described first embodiment, preferably a top pin type. The MTJ element MTJ at the upper portion is preferably a bottom pin type because the strained layer 18 is formed at the upper portion of the MTJ element MTJ.

Figure 51:
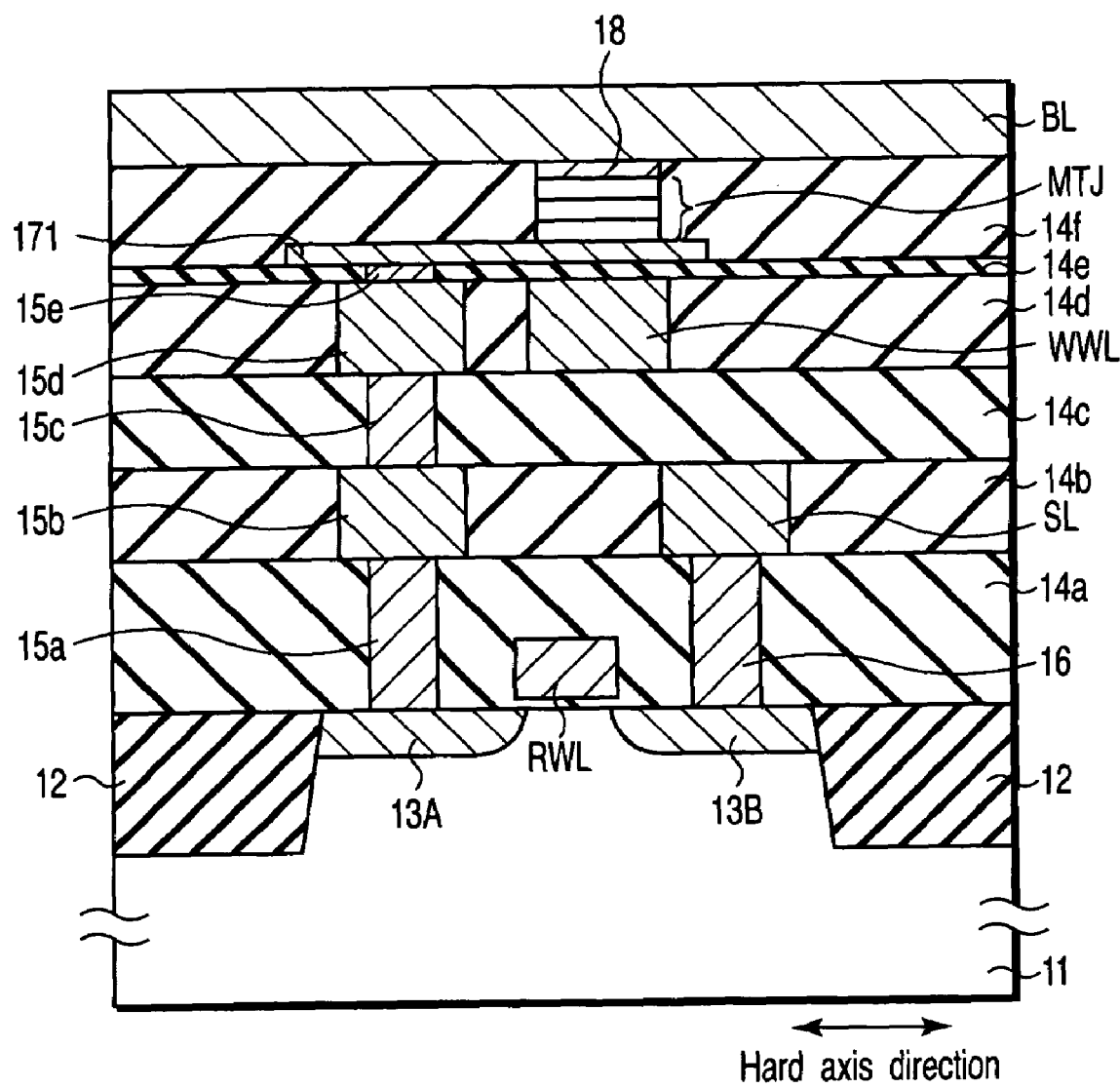
FIG. 51 is a sectional view showing a memory cell according to even another embodiment of the invention.

An embodiment of FIG. 51 is a modified example of the above-described first embodiment, and relates to a magnetic random access memory in which the strained layer 18 is disposed, not between a word line WWL and an MTJ element MTJ, but between an MTJ element MTJ and a data selecting line (write bit line) BL. In this case, the strained layer 18 is made of, not an insulating material, but a conductive material. The structure of the MTJ element MTJ is preferably a structure in which a memory layer is disposed at the strained layer 18 side (a bottom pin structure in the present embodiment).

Meanwhile, in all the embodiments which have been described above, it is possible that the magnetic anisotropy constant or magnetostriction constant of the ferromagnetic materials serving as the fixed layer and the ferromagnetic material serving as the memory layer of the MTJ element MTJ are made to be a same value, or conversely, are made to be different values.

When it is applied to the example of the present invention, it is preferable that a magnetic anisotropy constant of the fixed layer is set to be by far greater than an elastic energy due to the strained material having an electrostrictive effect, and a magnetic anisotropy constant of the memory layer is set to be about the same as an elastic energy due to the strained material having an electrostrictive effect.

Note that the magnetic anisotropy constant of the ferromagnetic material can be controlled by changing the type, the composition, the thickness, the crystal orientation, the crystal structure, or the like of the ferromagnetic material. For example, it is disclosed in "Magnetic Material" edited by Hiroshi Shimada and Kouji Yamada, KODANSHA, on Jun. 20, 1999. The ferromagnetic material used for the fixed layer is made of iron, cobalt, the alloy thereof, or the like, and the ferromagnetic material used for the memory layer is made of nickel, permalloy, or the like.

Further, in a case where a same ferromagnetic material (for example, permalloy) is used for both of the fixed layer and the memory layer, by controlling the condition for depositing the ferromagnetic materials, or the like, for example, a magnetostriction constant of the ferromagnetic material serving as the memory layer can be made greater than that of the ferromagnetic material serving as the fixed layer.

4. Writing Circuit

In the case of the magnetic random access memories according to the above-described first and second embodiments, a general writing circuit is used.

In the case of the magnetic random access memories according to the above-described third, fourth, and fifth embodiments, because the toggle writing method is applied thereto, a writing circuit using a writing method in which the timings of a current pulse which is made to flow into the two write lines are adjusted is used.

5. Reading Circuit

For a 1MOST+1MTJ type memory cell configured of one transistor and one MTJ element, a general reading circuit, for example, a reading circuit disclosed in [Roy Scheuerlein et al. "A 10 ns Read and Write Non-Volatile Memory Array Using a Magnetic Tunnel Junction and FET Switch in each Cell", ISSCC2000 Technical Digest, pp. 128–129] is used.

For a cross point type memory cell in which a selective transistor does not exist for each memory cell, and for the memory cell of the magnetic random access memory having a laminated MTJ structure as shown in the above-described sixth embodiment, the other reading circuit is used.

6. Others

In case of the magnetic random access memory which carries out writing by using an electrostrictive effect and a magnetostrictive effect, independent of a magnetic field generated by a write current. By using only electrostrictive/magnetostrictive phenomena, an extremely high voltage is required. Further, because there is dependence according to a position an MTJ element in an electrostrictive parameter, and dispersion exists in a magnetostrictive parameter of the ferromagnetic substance of the MTJ element as well, there is a high possibility that error writing is brought about.

In contrast thereto, in accordance with the example of the present embodiment, writing is executed, not only while utilizing an electrostrictive effect and a magnetostrictive effect, but also by using a magnetic field generated by a write current. Further, an electrostrictive effect and a magnetostrictive effect are used for controlling writing ease/difficulty for each MTJ element such that a switching magnetic field of a selected MTJ element is made little and a switching magnetic field of a half-selected MTJ element is made great, or the like. Accordingly, in accordance with the example of the present invention, even if a write current is reduced, error writing can be effectively prevented.

A magneto-optical memory having an electrostrictive film is a special memory which carries out writing by using a laser. Further, in this magneto-optical memory, an electrostrictive film and a magnetostrictive film are directly added to a memory layer, and the structure of the storage element is different from that in the example of the present invention.

Note that, in the above-described respective embodiments, the magnetic anisotropy of the ferromagnetic materials (the fixed layer and the memory layer) may be added in accordance with a shape of an MTJ element, and further, the shape is made to be a square, and magnetic anisotropy may be added in accordance with crystal anisotropy.

The example of the present invention can be applied regardless of a structure of a memory cell. Namely, the example of the present invention can be applied to a magnetic memory formed from, in addition to a memory cell having the above-described structure, various types of memory cells of a cross point type, a ladder type, and the like.

In accordance with the example of the present invention, because a switching magnetic field can be controlled for each MTJ element at the time of data writing, an asteroid curve having a shape on which regions to which a magnetic field in one of the easy axis direction and the hard axis direction is applied are more pointed, and regions to which magnetic fields in the both directions are applied are more depressed than that of the Stoner-Wohlfarth model, can be obtained. Accordingly, a magnetic random access memory can be proposed in which a write current can be reduced by reducing the coercive force of the memory layer, and even if the coercive force of the memory layer is reduced, error writing at the time of data writing can be effectively prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a magnetoresistive element;
   a write line; and
   a strained layer which is disposed in accordance with the magnetoresistive element, and which has a function of being physically deformed in shape at a time of data writing,
   wherein a size in an easy or hard axis direction of the strained layer is smaller than that of the magnetoresistive element.

2. The magnetic random access memory according to claim 1, wherein the strained layer is disposed between the magnetoresistive element and the write line.

3. The magnetic random access memory according to claim 1, wherein the strained layer is made of an insulating material having a piezoelectric effect or an electrostrictive effect.

4. The magnetic random access memory according to claim 1, wherein the magnetoresistive element has a fixed layer and a memory layer, and at least one of a composition, a thickness, a crystal orientation and a crystal structure of a ferromagnetic material of the fixed layer is different from that of the memory layer.

5. The magnetic random access memory according to claim 1, wherein the strained layer is physically deformed at the time of data writing.

6. The magnetic random access memory according to claim 5, wherein the magnetoresistive element is a half-selected magnetoresistive element which is exposed to only a generating magnetic field from one electric current, and the strained layer increases a switching magnetic field of the magnetoresistive element by applying a stress to the magnetoresistive element due to a deformation.

7. The magnetic random access memory according to claim 6, wherein, when the magnetostriction constant of the memory layer of the magnetoresistive element is positive, the strained layer applies a tensile stress in an easy axis direction to the magnetoresistive element.

8. The magnetic random access memory according to claim 6, wherein, when the magnetostriction constant of the memory layer of the magnetoresistive element is negative, the strained layer applies a tensile stress in a hard axis direction to the magnetoresistive element.

9. The magnetic random access memory according to claim 5, wherein the magnetoresistive element is a selected magnetoresistive element which is exposed to a generating magnetic field from at least two electric currents, and the strained layer decreases a switching magnetic field of the magnetoresistive element by applying the stress.

10. The magnetic random access memory according to claim 9, wherein, when the magnetostriction constant of the memory layer of the magnetoresistive element is positive, the strained layer applies a tensile stress in the hard axis direction to the magnetoresistive element.

11. The magnetic random access memory according to claim 9, wherein, when the magnetostriction constant of the memory layer of the magnetoresistive element is negative, the strained layer applies a tensile stress in the easy axis direction to the magnetoresistive element.

12. The magnetic random access memory according to claim 1, wherein the strained layer is released from a physically deformed state at the time of data writing.

13. The magnetic random access memory according to claim 12, wherein the magnetoresistive element is a half-selected magnetoresistive element which is exposed to only a generating magnetic field from one electric current, and the strained layer increases a switching magnetic field of the magnetoresistive element by relaxing a stress due to a release from the deformed state.

14. The magnetic random access memory according to claim 13, wherein, when the magnetostriction constant of the memory layer of the magnetoresistive element is positive, the strained layer relaxes a tensile stress in the hard axis direction which has been applied to the magnetoresistive element in advance.

15. The magnetic random access memory according to claim 13, wherein, when the magnetostriction constant of the memory layer of the magnetoresistive element is negative, the strained layer relaxes a tensile stress in the easy axis direction which has been applied to the magnetoresistive element in advance.

16. The magnetic random access memory according to claim 12, wherein the magnetoresistive element is a selected magnetoresistive element which is exposed to a generating magnetic field from at least two electric currents, and the strained layer decreases a switching magnetic field of the magnetoresistive element by relaxing the stress.

17. The magnetic random access memory according to claim 16, wherein, when the magnetostriction constant of the memory layer of the magnetoresistive element is positive, the strained layer relaxes a tensile stress in the easy axis direction which has been applied to the magnetoresistive element in advance.

18. The magnetic random access memory according to claim 16, wherein, when the magnetostriction constant of the memory layer of the magnetoresistive element is negative, the strained layer relaxes a tensile stress in the hard axis direction which has been applied to the magnetoresistive element in advance.

19. A magnetic random access memory comprising:

a magnetoresistive element;

a metal layer at one end of the magnetoresistive element;

a write line for use in generation of a magnetic field for data writing with respect to the magnetoresistive element;

a strained layer between the magnetoresistive element and the write line, and having a function of being physically deformed in accordance with a voltage; and a capacitor which is formed from the metal layer, the strained layer and the write line, wherein a size in an easy or hard axis direction of the strained layer is smaller than that of the magnetoresistive element, and the voltage is applied to the capacitor.

20. The magnetic random access memory according to claim 19, wherein the strained layer is made of an insulating material having a piezoelectric effect or an electrostrictive effect.

* * * * *